US011188817B2

(12) United States Patent
Dikici et al.

(10) Patent No.: US 11,188,817 B2
(45) Date of Patent: Nov. 30, 2021

(54) METHODS AND SYSTEMS FOR CONVERTING WEIGHTS OF A DEEP NEURAL NETWORK FROM A FIRST NUMBER FORMAT TO A SECOND NUMBER FORMAT

(71) Applicant: Imagination Technologies Limited, Kings Langley (GB)

(72) Inventors: Cagatay Dikici, London (GB); Paul Brasnett, West Molesey (GB); Muhammad Asad, London (GB); Stephen Morphet, St. Albans (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 17/000,468

(22) Filed: Aug. 24, 2020

(65) Prior Publication Data
US 2021/0073614 A1  Mar. 11, 2021

(30) Foreign Application Priority Data

Aug. 22, 2019 (GB) ...................................... 1912083

(51) Int. Cl.
*G06N 3/063* (2006.01)
*G06N 3/04* (2006.01)
*H03M 7/24* (2006.01)
*H03M 7/30* (2006.01)

(52) U.S. Cl.
CPC ............... *G06N 3/063* (2013.01); *G06N 3/04* (2013.01); *H03M 7/24* (2013.01); *H03M 7/3059* (2013.01)

(58) Field of Classification Search
CPC ............. G06N 3/04; G06N 3/08; G06N 3/063
See application file for complete search history.

(56) References Cited

U.S. PATENT DOCUMENTS

2017/0323197 A1* 11/2017 Gibson ..................... G06N 3/08
2019/0050710 A1*  2/2019 Wang ...................... G06N 3/063
(Continued)

FOREIGN PATENT DOCUMENTS

| CN | 110276451 A | 9/2019 |
|---|---|---|
| EP | 3480690 A1 | 5/2019 |
| EP | 3480744 A1 | 5/2019 |

OTHER PUBLICATIONS

Hou, Lu et al.; Loss-Aware Binarization of Deep Networks; Published as a conference paper at ICLR 2017; pp. 1-11. (Year: 2017).*

(Continued)

*Primary Examiner* — Stanley K. Hill
(74) *Attorney, Agent, or Firm* — Potomac Law Group, PLLC; Vincent M DeLuca

(57) ABSTRACT

Methods and system for converting a plurality of weights of a filter of a Deep Neural Network (DNN) in a first number format to a second number format, the second number format having less precision than the first number format, to enable the DNN to be implemented in hardware logic. The method comprising: determining, for each of the plurality of weights, a quantisation error associated with quantising that weight to the second number format in accordance with a first quantisation method; determining a total quantisation error for the plurality of weights based on the quantisation errors for the plurality of weights; identifying a subset of the plurality of weights to be quantised to the second number format in accordance with a second quantisation method based on the total quantisation error for the plurality of weights; and generating a set of quantised weights representing the plurality of weights in the second number format, the quantised weight for each weight in the subset of the plurality of weights based on quantising that weight to the second number format in accordance with the second quantisation method and the quantised weight for each of the (Continued)

remaining weights of the plurality of weights based on quantising that weight to the second number format in accordance with the first quantisation method.

20 Claims, 19 Drawing Sheets

(56) References Cited

U.S. PATENT DOCUMENTS

2019/0138882 A1    5/2019    Choi et al.
2019/0171935 A1*  6/2019    Agrawal .............. G06N 3/0445
2021/0034955 A1*  2/2021    Sather .................. G06N 3/063

OTHER PUBLICATIONS

Guo, Ynhui et al.; A Survey on Methods and Theories of Quantized Neural Networks; 2018; 17 pages. (Year: 2018).*

Zhou, Aojun et al.; Incremental Network Quantization: Towards Lossless CNNS With Low-Precision; Published as a conference paper at ICLR 2017; pp. 1-14. (Year: 2017).*

Choi, Yoojin et al.; Towards the Limit of Network Quantization; Published as a conference paper at ICLR 2017; pp. 1-14. (Year: 2017).*

Jacob, Benoit et al.; Quantization and Training of Neural Networks for Efficient Integer-Arithmetic-Only Inference; 2018; CVPR paper; pp. 2704-2713. (Year: 2018).*

Gupta et al; "Deep Learning with Limited Numerical Precision"; arxiv.org, Cornell University Library; Feb. 9, 2015; pp. 1-10.

Lin et al; "Fixed Point Quantization of Deep Convolutional Networks"; URL:https://arxiv.org/pdf/1511.06393.pdf; Jun. 2, 2016; pp. 1-10.

Louizos et al; "Relaxed Quantization for Discretized Neural Networks"; arxiv.org, Cornell University Library; Oct. 3, 2018; pp. 1-14.

Tostado et al; "Performance Trade-offs in Weight Quantization for Memory-Efficient Inference"; 2019 IEEE International Conference on Artificial Intelligence Circuits and Systems (AICAS); Mar. 18, 2019; pp. 246-250.

* cited by examiner

METHODS AND SYSTEMS FOR CONVERTING WEIGHTS OF A DEEP NEURAL NETWORK FROM A FIRST NUMBER FORMAT TO A SECOND NUMBER FORMAT

BACKGROUND

A Deep Neural Network (DNN) is a form of artificial neural network comprising a plurality of interconnected layers that can be used for machine learning applications. In particular, a DNN can be used in signal processing applications, including image processing and computer vision applications. FIG. 1 illustrates an example DNN 100 that comprises a plurality of layers 102-1, 102-2, 102-3. Each layer 102-1, 102-2, 102-3 receives input data, processes the input data in accordance with the layer to produce output data. The output data is either provided to another layer as the input data, or is output as the final output data of the DNN. For example, in the DNN 100 FIG. 1 the first layer 102-1 receives the original input data 104 to the DNN 100, and processes the input data in accordance with the first layer 102-1 to produce output data. The output data of the first layer 102-1 becomes the input data to the second layer 102-2, which processes the input data in accordance with the second layer 102-2 to produce output data. The output data of the second layer 102-2 becomes the input data to the third layer 102-3, which processes the input data in accordance with the third layer 102-3 to produce output data. The output data of the third layer 102-3 is output as the output data 106 of the DNN.

The processing that is performed on the input data to a layer depends on the type of layer. For example, each layer of a DNN may be one of a plurality of different types. Example DNN layer types include, but are not limited to a convolution layer, an activation layer, a normalisation layer, a pooling layer and a fully connected layer. It will be evident to a person of skill in the art that these are example DNN layer types and that this is not an exhaustive list and there may be other DNN layer types.

For a convolution layer, the input data is processed by convolving the input data with weights associated with that layer. Specifically, each convolution layer is associated with a plurality of weights $w_0 \ldots w_g$, which may also be referred to as filter weights or coefficients. The weights are grouped to form, or define, one or more filters, which may also be referred to as kernels, and each filter may be associated with an offset bias b.

Reference is made to FIG. 2 which illustrates an example overview of the format of data utilised in a DNN. As can be seen in FIG. 2, the data used in a DNN may be formed of a plurality of planes. The input data may be arranged as P planes of data, where each plane has a dimension x×y. A DNN may comprise one or more convolution layers each of which has associated therewith a plurality of filters each of which comprise a plurality of weights. Each filter has a dimension m×n×P (i.e. each filter comprises a set of m×n×P weights w) and is applied to the input data according to a convolution operation across steps s and t in the x and y directions, as illustrated in FIG. 2. The number of filters and the number of weights per filter may vary between convolution layers. A convolutional neural network (CNN), which is a specific type of DNN that is effective for image recognition and classification, generally comprises a plurality of convolution layers.

An activation layer, which typically, but not necessarily follows a convolution layer, performs one or more activation functions on the input data to the layer. An activation function takes a single number and performs a certain non-linear mathematical operation on it. In some examples, an activation layer may act as a rectified linear unit (ReLU) by implementing an ReLU function (i.e. $f(x)=\max(0, x)$) or a Parametric Rectified Linear Unit (PReLU) by implementing a PReLU function.

A normalisation layer is configured to perform a normalizing function, such as a Local Response Normalisation (LRN) function on the input data. A pooling layer, which is typically, but not necessarily inserted between successive convolution layers, performs a pooling function, such as a max or mean function, to summarise subsets of the input data. The purpose of a pooling layer is thus to reduce the spatial size of the representation to reduce the number of parameters and computation in the network, and hence to also control overfitting.

A fully connected layer, which typically, but not necessarily follows a plurality of convolution and pooling layers takes a three-dimensional set of input data values and outputs an C dimensional vector. Where the DNN is used for classification, C is the number of classes and each value in the vector represents the probability of a certain class. The C dimensional vector is generated through a matrix multiplication of a set of weights, optionally followed by a bias offset. A fully connected layer thus receives a set of weights and a bias.

Accordingly, as shown in FIG. 3, each layer 302 of a DNN receives input data values and generates output data values; and some layers (such as convolution layers and fully-connected layers) also receive weights and/or biases.

Hardware logic that can be configured to implement a DNN comprises hardware logic that can be configured to process input data to the DNN in accordance with the layers of the DNN. Specifically, hardware logic that can implement a DNN comprises hardware logic that can be configured to process the input data to each layer in accordance with that layer and generate output data for that layer which either becomes the input data to another layer or becomes the output of the DNN. For example, if a DNN comprises a convolution layer followed by an activation layer, hardware logic that can be configured to implement that DNN comprises hardware logic that can be configured to perform a convolution on the input data to the DNN using the weights and biases associated with that convolution layer to produce output data for the convolution layer, and hardware logic that can be configured to apply an activation function to the input data to the activation layer (i.e. the output data of the convolution layer) to generate output data for the DNN.

As is known to those of skill in the art, for hardware to process a set of values each value is represented in a number format. The two most suitable number formats are fixed point number formats and floating point number formats. As is known to those skilled in the art, a fixed point number format has a fixed number of digits after the radix point (e.g. decimal point or binary point). In contrast, a floating point number format does not have a fixed radix point (i.e. it can "float"). In other words, the radix point can be placed anywhere within the representation. While representing values input to, and output from, the layers of a DNN in a floating point number format may allow more accurate or precise output data to be produced, processing numbers in a floating point number format in hardware is complex which tends to increase the silicon area and complexity of the hardware compared to hardware that processes values in fixed point number formats. Accordingly, hardware logic that can be configured to implement a DNN may be configured to represent values input to, and/or output from, the layers of a DNN in a fixed point number format to reduce the area, power consumption and memory bandwidth of the hardware logic.

A DNN (a set of interconnected layers) can be trained to perform a desired task (e.g. image processing). As is known to those of skill in the art, training a DNN means identifying values for the weights of the DNN (e.g. the weights of the convolution and fully connected layers) to perform the desired task. Training generally comprises providing training data (e.g. data representing expected input data) to a model of the DNN and adjusting the weights of the DNN until a desired output is obtained for the training data. A DNN is typically "trained" using input values and weights in a floating point number format. A DNN that uses floating point number formats for the input values and weights is referred to herein as a floating point DNN. Where, however, the hardware logic that is to be used to implement the DNN is configured to use fixed point number formats for the input values and weights, the input values and trained weights are quantised to the desired fixed point number formats and the hardware logic is configured to use the quantised input values and weights to implement the DNN. This process of quantising the weights is referred to herein as converting the floating point DNN to a fixed point DNN.

Quantising the input values and the weights results in quantisation errors which may reduce the accuracy of the DNN. This is especially true when a low number of bits (e.g. 8 bits or less) are used to represent the input values and weights of the DNN. Where the accuracy of the DNN falls below a predetermined acceptable level the DNN may be retrained to compensate for the quantisation errors. In other words, after quantisation one or more of the weights may be adjusted via re-training of the DNN. However, in some cases re-training the DNN may not be practical or possible. For example, in some cases the training of a DNN may be performed by one entity and configuring hardware to implement a DNN (including quantising the input data values and weights of the DNN to fixed point number formats) may be performed by a second entity that may not have access to the training data.

Accordingly, there is a need for an alternate method of converting a floating point DNN into a fixed point DNN. In particular, there is a need for a method of converting the weights of a floating point DNN to a fixed point number format such that the resultant fixed point DNN has a sufficient level of accuracy without retraining the DNN.

The embodiments described below are provided by way of example only and are not limiting of implementations which solve any or all of the disadvantages of methods and systems for converting a floating point DNN to a fixed point DNN and in particular for converting the weights of a floating point DNN to a fixed point number format for use in configuring hardware to implement the DNN.

SUMMARY

This summary is provided to introduce a selection of concepts that are further described below in the detailed description. This summary is not intended to identify key features or essential features of the claimed subject matter, nor is it intended to be used to limit the scope of the claimed subject matter.

Described herein are methods and systems for converting a plurality of weights of a filter of a Deep Neural Network (DNN) from a first number format to a second, lower precision, number format to enable the DNN to be implemented in hardware logic. The method includes determining, for each of the plurality of weights, a quantisation error associated with quantising that weight to the second number format in accordance with a first quantisation method; determining a total quantisation error for the plurality of weights based on the quantisation errors for the plurality of weights; identifying a subset of the weights to be quantised to the second number format in accordance with a second quantisation method based on the total quantisation error for the plurality of weights; and generating a set of quantised weights representing the plurality of weights in the second number format, the quantised weight for each weight in the subset of the plurality of weights based on quantising that weight to the second number format in accordance with the second quantisation method and the quantised weight for each of the remaining weights of the plurality of weights based on quantising that weight to the second number format in accordance with the first quantisation method.

A first aspect provides a computer-implemented method of converting a plurality of weights of a filter of a Deep Neural Network "DNN" in a first number format to a second number format to enable the DNN to be implemented in hardware logic, the second number format having less precision than the first number format, the method comprising: determining, for each of the plurality of weights, a quantisation error associated with quantising that weight to the second number format in accordance with a first quantisation method; determining a total quantisation error for the plurality of weights based on the quantisation errors for the plurality of weights; identifying a subset of the plurality of weights to be quantised to the second number format in accordance with a second quantisation method based on the total quantisation error for the plurality of weights; and generating a set of quantised weights representing the plurality of weights in the second number format, the quantised weight for each weight in the subset of the plurality of weights based on quantising that weight to the second number format in accordance with the second quantisation method and the quantised weight for each of the remaining weights of the plurality of weights based on quantising that weight to the second number format in accordance with the first quantisation method.

A second aspect provides a method of converting a filter of a Deep Neural Network "DNN" from a first number format to a second number format to enable the DNN to be implemented in hardware logic, the filter comprising a plurality of weights, the second number format having less precision than the first number format, the method comprising: sub-dividing the plurality of weights of the filter into a plurality of non-overlapping subsets of weights; and performing the method of the first aspect for each subset of weights.

A third aspect provides a computing-based device to convert a plurality of weights of a filter of a Deep Neural Network "DNN" in a first number format to a second number format to enable the DNN to be implemented in hardware logic, the second number format having less precision than the first number format, the computing-based device comprising: at least one processor; and memory coupled to the at least one processor, the memory comprising: computer readable code that when executed by the at least one processor causes the at least one processor to: determine, for each of the plurality of weights, a quantisation error associated with quantising that weight to the second number format in accordance with a first quantisation method; determine a total quantisation error for the plurality of weights based on the quantisation errors for the plurality of weights; identify a subset of the plurality of weights in the first number format to be quantised to the second number format in accordance with a second quantisation method based on the total quantisation error for the plurality of weights; and generate a set of quantised weights representing the plurality of weights in the second number format, the quantised weight for each weight in the subset of the plurality of weights based on quantising that weight to the second number format in accordance with the second quantisation method and the quantised weight for each of the remaining weights of the plurality of weights based on quantising that weight to the second number format in accordance with the first quantisation method.

A fourth aspect provides hardware logic configured to implement a Deep Neural Network "DNN" wherein the weights of a filter of the DNN are in a fixed point number format generated in accordance with the method of the first aspect or the second aspect.

The hardware logic configurable to implement a DNN (e.g. DNN accelerator) may be embodied in hardware on an integrated circuit. There may be provided a method of manufacturing, at an integrated circuit manufacturing system, the hardware logic configurable to implement a DNN (e.g. DNN accelerator). There may be provided an integrated circuit definition dataset that, when processed in an integrated circuit manufacturing system, configures the system to manufacture the hardware logic configurable to implement a DNN (e.g. DNN accelerator). There may be provided a non-transitory computer readable storage medium having stored thereon a computer readable description of hardware logic configurable to implement a DNN (e.g. DNN accelerator) that, when processed in an integrated circuit manufacturing system, causes the integrated circuit manufacturing system to manufacture an integrated circuit embodying hardware logic configurable to implement a DNN (e.g. DNN accelerator).

There may be provided an integrated circuit manufacturing system comprising: a non-transitory computer readable storage medium having stored thereon a computer readable description of hardware logic configurable to implement a DNN (e.g. DNN accelerator); a layout processing system configured to process the computer readable description so as to generate a circuit layout description of an integrated circuit embodying the hardware logic configurable to implement a DNN (e.g. DNN accelerator); and an integrated circuit generation system configured to manufacture the hardware logic configurable to implement a DNN (e.g. DNN accelerator) according to the circuit layout description.

There may be provided computer program code for performing a method as described herein. There may be provided non-transitory computer readable storage medium having stored thereon computer readable instructions that, when executed at a computer system, cause the computer system to perform the methods as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
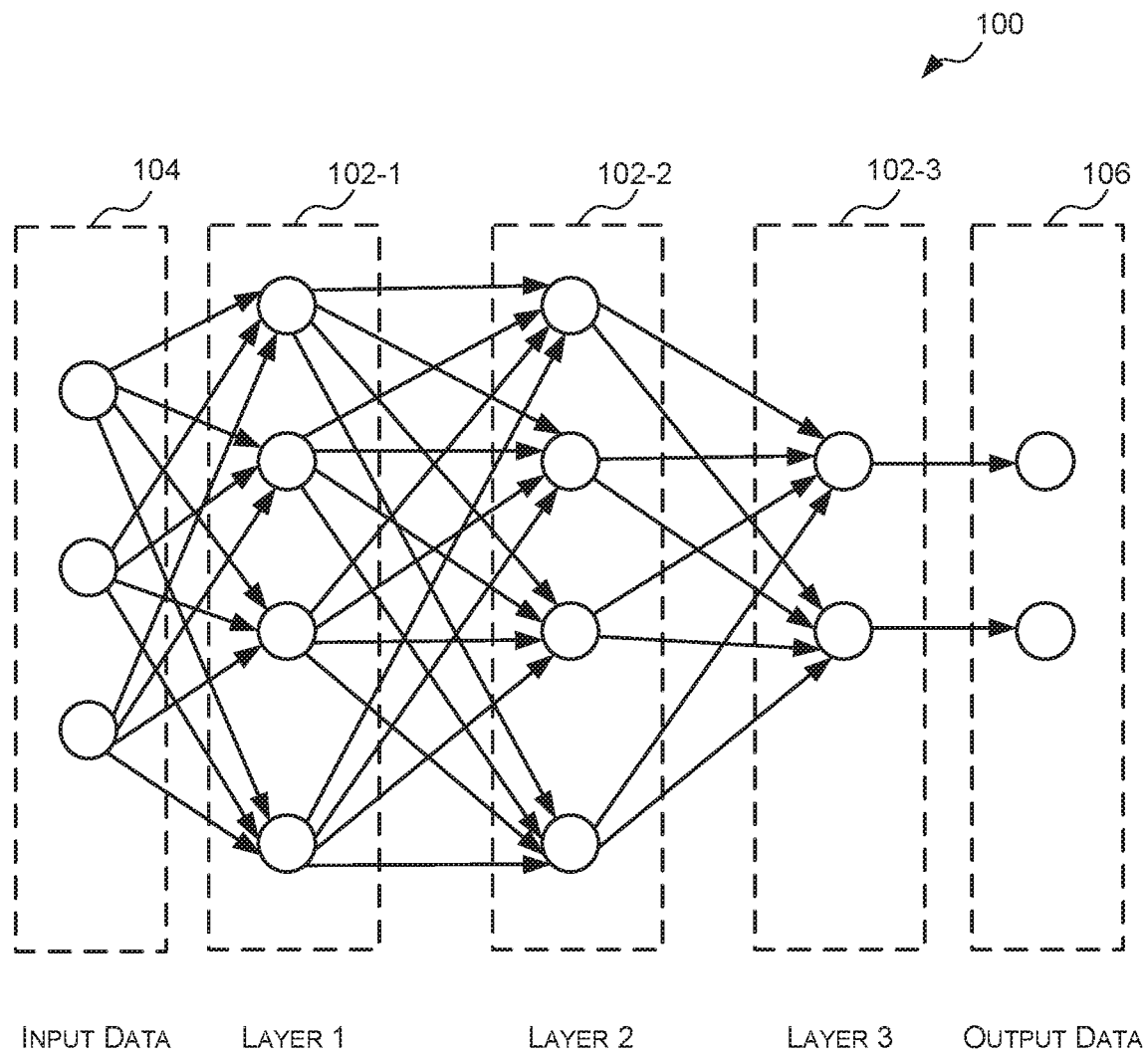
FIG. 1 is a schematic diagram of an example deep neural network (DNN)

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

As described above, to reduce the silicon area and complexity thereof, hardware logic (e.g. a DNN accelerator) that can be configured to implement a DNN may be configured to receive and process input values and weights in fixed point number formats. However, DNNs are typically trained (at least initially) using input values and weights in floating point number formats. Accordingly, to implement a floating point DNN using such hardware (e.g. a DNN accelerator) the floating point DNN is converted into a fixed point DNN. This comprises quantising the input values and weights into one or more fixed point number formats. However, quantising the input values and weights results in quantisation errors which may cause the accuracy of the fixed point DNN to be reduced relative to the floating point DNN. In some cases, this may be addressed by retraining the DNN after the quantisation to adjust one or more of the weights. However, as described above, retraining is not always practical or possible.

Accordingly, described herein are methods and systems for converting the weights of a DNN in a first set of number formats (e.g. floating point number formats) into a second set of lower precision number formats (e.g. fixed point number formats) that results in a DNN that has good accuracy without retraining. The methods comprise converting the weights in the first set of number formats into the second set of number formats on a per filter (or per sub-filter) basis to minimise the drifting effect caused by quantisation residuals. Specifically, the methods comprise for a plurality of weights of a filter, determining, for each of the plurality of weights, a quantisation error associated with quantising that weight to the second number format in accordance with a first quantisation method; determining a total quantisation error for the plurality of weights based on the quantisation errors for the plurality of weights; identifying a subset of the weights to be quantised to the second number format in accordance with a second quantisation method based on the total quantisation error for the plurality of weights; and generating a set of quantised weights representing the plurality of weights in the second number format, the quantised weight for each weight in the subset of the plurality of weights based on quantising that weight to the second number format in accordance with the second quantisation method and the quantised weight for each of the remaining weights of the plurality of weights based on quantising that weight to the second number format in accordance with the first quantisation method. The method may be executed for all or only a subset of the filters of the DNN.

In some cases, the second quantisation method is configured to change the direction of rounding for a particular weight relative to the first quantisation method such that if quantising a weight in accordance with the first quantisation method produces a quantisation error with a first sign (e.g. the quantisation error is positive) then quantising the same weight in accordance with the second quantisation method may produce a quantisation error with a second, different, sign (e.g. the quantisation error is negative). For example, a weight that is rounded up in accordance with the first quantisation method may be rounded down in accordance with the second quantisation method, and a weight that is rounded up in accordance with the first quantisation method may be rounded down in accordance with the second quantisation method. By reversing the sign of the quantisation error for some of the weights the total quantisation error for the set of weights may be pushed towards zero.

The methods described herein can be used to convert the weights of a floating point DNN into a fixed point number format that results in a fixed point DNN that has an accuracy substantially similar to the corresponding floating point DNN without retraining. The methods described herein can also be implemented efficiently in terms of computing resources and computing time.

Figure 4:
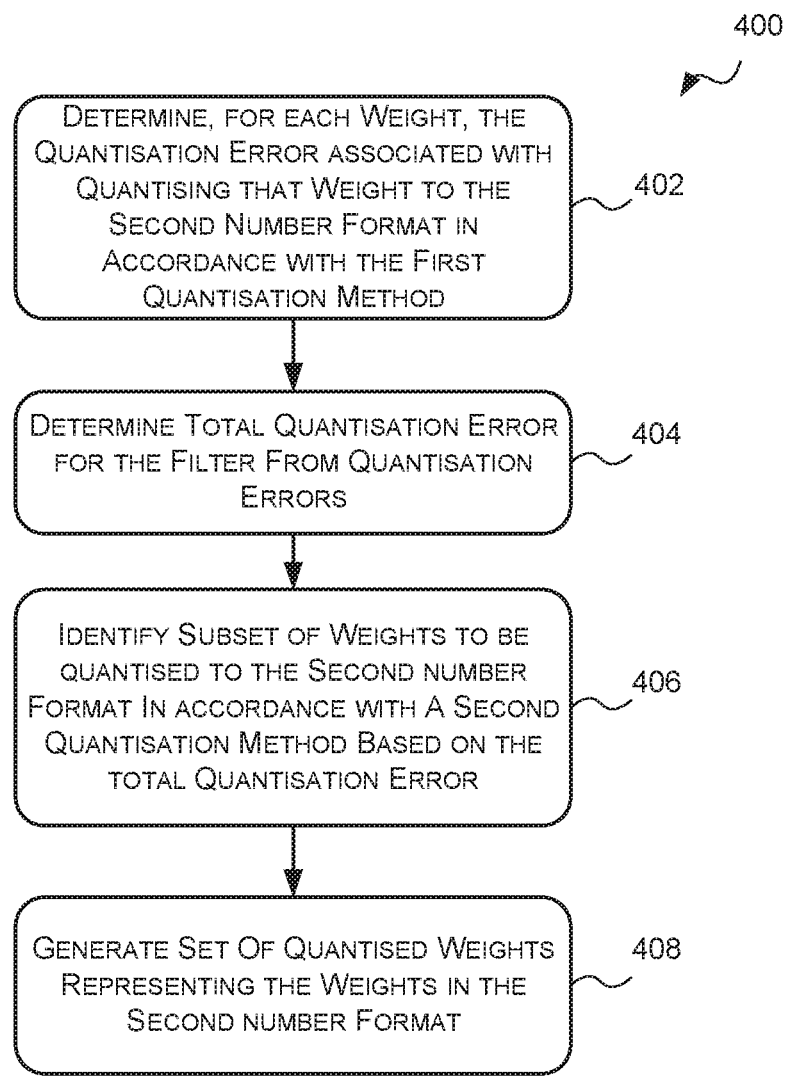
FIG. 4 is a flow diagram of a first example method of converting the weights of a DNN filter from a first number format to a second, lower precision, number format.

Reference is now made to FIG. 4 which illustrates an example method 400 for converting the weights of a DNN filter in a first number format to a second, lower precision, number format so as to enable the DNN to be implemented in hardware logic. In some cases (e.g. when the method is being used as part of a floating point DNN to fixed point DNN conversion) the first number format is a floating point number format and the second number format is a fixed point number format. However, in other cases both the first and second number formats may be fixed point number formats.

The most common floating point number format is the Institute of Electrical and Electronics Engineers (IEEE) standard for floating-point arithmetic (IEEE-754). IEEE-754 specifies that floating point numbers are represented by three numbers: sign, exponent and mantissa (s, exp, mant). In general, the three numbers (s, exp, mant) are interpreted, for a fixed integer bias, as shown in equation (1):

$$(-1)^s 2^{exp-bias} 1.mant \qquad (1)$$

IEEE-754 defines the four basic formats shown in Table 1 for floating point numbers with varying degrees of precision. In particular, they are encoded with 16, 32, 64 and 128 bits respectively.

TABLE 1

| Type | Name | Sign Width | Exponent Width (ew) | Mantissa Width (mw) | Bias $2^{ew-1} - 1$ |
|---|---|---|---|---|---|
| Half | F16 | 1 | 5 | 10 | 15 |
| Single | F32 | 1 | 8 | 23 | 127 |
| Double | F64 | 1 | 11 | 52 | 1023 |
| Quad | F128 | 1 | 15 | 112 | 16383 |

In some cases, the first number format is in one of the IEEE floating point number formats. For example, the first number format may be the F32 floating point number format. However, in other examples the first number format may be another floating point number format or may be a fixed point number format.

A common fixed point number format is the Q format, which specifies a predetermined number of integer bits a and fractional bits b. The integer bits may use two's complement to represent signed values. Accordingly, a number can be represented as Qa.b which requires a total of a+b bits (or, in some conventions, a+b+1 bits, when a sign bit is not counted in the value of a). Example Q formats are illustrated in Table 2 below.

TABLE 2

| Q Format | Description | Example |
|---|---|---|
| Q4.4 | 4 integer bits and 4 fractional bits | $0110.1110_2$ |
| Q0.8 | 0 integer bits and 8 fractional bits | $.01101110_2$ |

However, the Q format has a shortcoming in that some of the bits used to represent the number may be considered to be redundant. In an example, a number range [−0.125, 0.125) is to be represented to a precision of 3 bits. The required Q format for this example range and precision is Q0.5. However, if it is assumed that the range of values is known in advance, the first two bits of the number will never be used in determining the value represented in Q format. For example, the first two bits of the representation do not contribute to the final number since they represent 0.5 and 0.25 respectively and therefore fall outside of the required range. However, they are used to indicate the value of the third bit position (i.e. 0.125 and beyond due to the relative bit positions). Accordingly, the Q format described above is an inefficient fixed point number format for use within hardware logic configurable to implement a DNN (e.g. DNN accelerator) since some bits may not convey useful information.

Therefore, in some cases, instead of using the Q format, hardware logic configurable to implement a DNN may be configured to use fixed point number formats for the input values and/or weights of a DNN wherein a value z is represented by a fixed integer exponent exp and an n-bit mantissa m format $z=2^{exp} m$ which is defined by the exponent exp and the number n of mantissa bits {exp, n}. The fixed integer exponent exp may be determined in advance according to the number range that is required to be represented, and may be common to a set of values (e.g. a set of input values or weights). In some cases, the mantissa m may be represented in two's complement format, and in other cases other signed or unsigned integer formats may be used.

As described above, each filter W of a DNN comprises one or more weights w. Different filters of a DNN may have different numbers of weights. However, each filter of the same layer typically has the same dimensions and thus the same number of weights. The method 400 may be implemented by a computing-based device such as the computing-based device 1700 described below with respect to FIG. 17. For example, there may be computer readable storage medium having stored thereon computer readable instructions that, when executed at a computing-based device, cause the computing-based device to perform the method 400 of FIG. 4.

The method 400 begins at block 402 where, for each of the plurality of weights, a quantisation error associated with quantising that weight to the second number format in accordance with a first quantisation method is determined.

As is known to those of skill in the art, quantisation is the process of converting a number from a higher precision format to a lower precision format. The set of rules used to convert a number from a higher precision format to a lower precision format is referred to herein as a quantisation method. Quantising a number in a higher precision format generally comprises representing the number in the higher precision format using one of the representable numbers in the lower precision format wherein the representable number in the lower precision format is selected by a particular rounding mode (such as, but not limited to round to nearest (RTN), round towards zero (RTZ), round to nearest even (RTE), round towards positive infinity (RTP), and round towards negative infinity (RTN)). The quantised version of a weight w is denoted $w^q$.

Equation (2) sets out an example formula for quantising a weight w in a first number format into a value $w^q$ in a second number format where $X_{max}$ is the highest representable number in the second number format, $X_{min}$ is the lowest representable number in the second number format, and RND(w) is a rounding function:

$$w^q = \begin{cases} X_{max}, & \text{if } w \geq X_{max} \\ X_{min}, & \text{if } w \leq X_{min} \\ 0, & \text{if } w = 0 \\ RND(w), & \text{otherwise} \end{cases} \quad (2)$$

The formula set out in equation (2) quantises a weight in a first number format to one of the representable numbers in the second number format where the representable number in the second number format is selected based on the rounding mode RND (e.g. RTN, RTZ, RTE, RTP or RTN). Where a weight is greater than the highest representable value in the second number format (e.g. $w \geq X_{max}$) or where a weight is smaller than the lowest representable value in the second number format (e.g. $w \leq X_{min}$), the quantised weight $w^q$ may be clamped to $X_{max}$ or $X_{min}$ respectively. A quantised value that has been clamped in this way is said to be saturated. The input values may be quantised in a similar manner.

Figure 5:
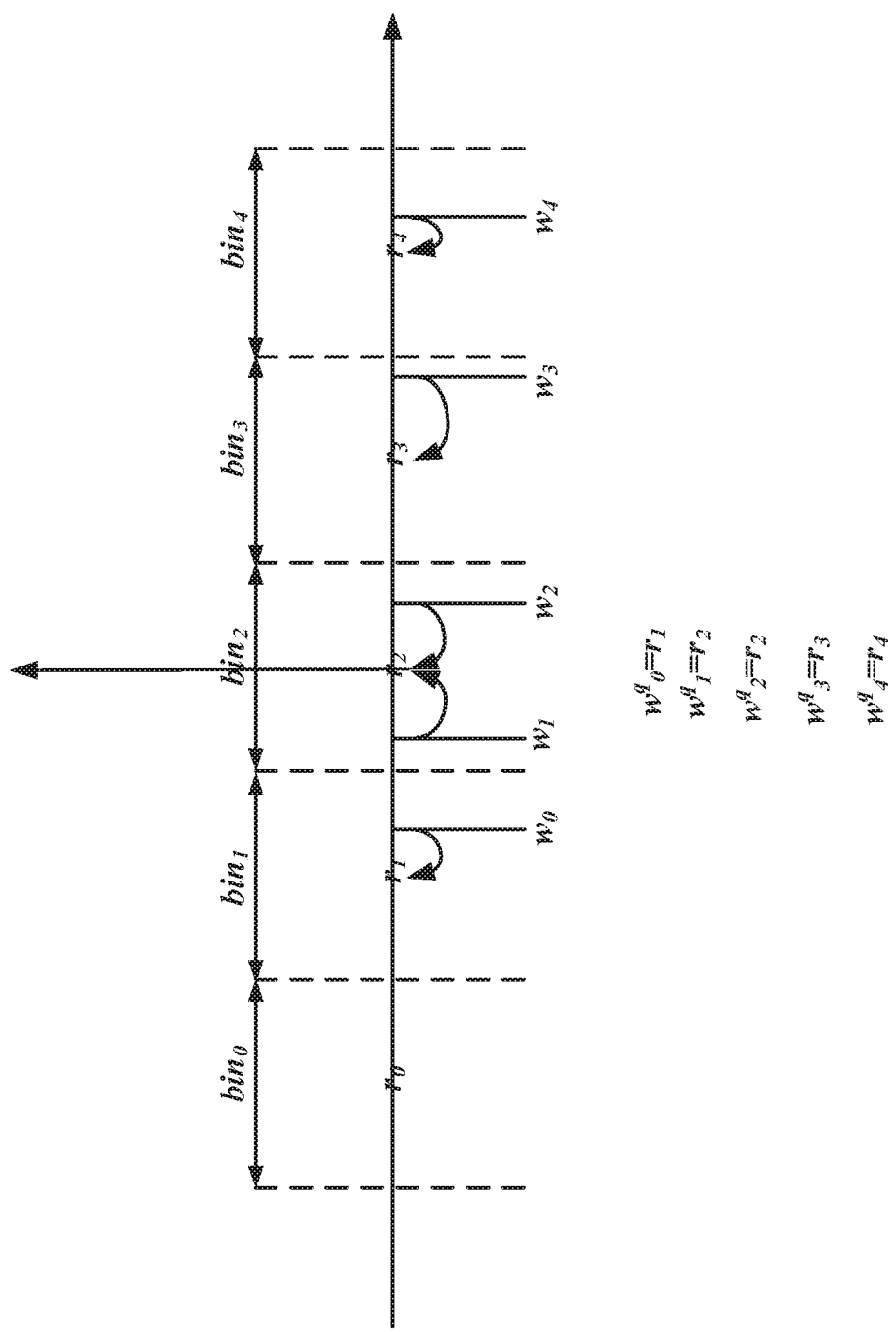
FIG. 5 is a schematic diagram illustrating quantisation of an example set of weights to a fixed point number format.

As shown in FIG. 5, a fixed point number format will be able to represent a plurality of equally spaced numbers ($r_0$, $r_1$, $r_2$, $r_3$, $r_4$), which are referred to as the representable numbers of the fixed point number format. Each weight is quantised to the fixed point number format by selecting one of the representable numbers of the fixed point number format to represent the weight according to a rounding mode. When a weight is quantised in accordance with equation (2) when the round to nearest (RTN) rounding mode is used, the representable number that is selected for a particular weight is the representable number that is the closest to the weight (i.e. the distance or difference between the weight and the representable number is the smallest). Accordingly, as shown in FIG. 5, a particular representable number will be selected to represent a weight if the weight falls within a bin centred around the representable number and having a span of the step size. The step size of a fixed point number format is the distance or difference between any two consecutive representable numbers. Where the fixed point number format is defined by a mantissa bit length n and an exponent exp the step size is equal to $2^{exp}$. For example, in FIG. 5 the first weight $w_0$ falls within the second bin $bin_1$ centred on the second representable number $r_1$ thus the first weight $w_0$ is quantised to the second representable number $r_1$. Similarly, the second and third weights $w_1$ and $w_2$ fall within the third bin $bin_2$ centred on the third representable number $r_2$ thus both the second and third weights $w_1$ and $w_2$ are quantised to the third representable number $r_2$; the fourth weight $w_3$ falls within the fourth bin $bin_3$ centred on the fourth representable number $r_3$ thus the fourth weight $w_3$ is quantised to the fourth representable number $r_3$; and the fifth weight $w_4$ falls within the fifth bin $bin_4$ centred on the fifth representable number $r_4$ thus the fifth weight is quantised to the fifth representable number $r_4$.

In some cases, quantising a weight in the first number format to the second number format in accordance with the first quantisation method comprises quantising a weight in the first number format to the second number format in accordance with equation (2) for a particular rounding mode (e.g. round to nearest (RTN)).

The second number format for the filter may be selected in any suitable manner. For example, to reduce the size, and the increase the efficiency of hardware logic configurable to implement a DNN (e.g. DNN accelerator) the hardware logic may be configured to represent values input to, or output from, layers of a DNN in fixed point number formats that use the smallest number of bits that are able to represent the expected or desired range for each set of values. Since the range for different sets of values (e.g. input data values, output data values, biases and weights), may vary within a layer and between layers hardware logic configurable to implement a DNN (e.g. DNN accelerator) may be able to implement a DNN more efficiently if it can use fixed point number formats to represent the input data values, output data values, weights and/or biases, that can vary within a layer and between layers. For example, the hardware logic configurable to implement a DNN (e.g. DNN accelerator) may be able to implement the DNN more efficiently by using a fixed point number format comprising an exponent of 2 and a mantissa bit length of 6 to represent the input data values for a first layer, a fixed point number format comprising an exponent of 3 and a mantissa bit length of 12 to represent the weights of the first layer, and a fixed point number format comprising an exponent of 4 and a mantissa bit length of 6 to represent the input data values for a second layer.

Example methods for selecting fixed point number formats for data input to and/or output from a layer (including the weights of a layer) are described in the applicant's UK Patent Application Nos. 1718292.4, 1718293.2, 1718295.7 and 1718289.0 and are herein incorporated by reference in their entirety. In some cases, such as when the hardware logic that is to be used to implement the DNN supports different fixed point formats for filters of the same layer, the fixed point formats may vary between filters of the same layer. In other cases, all the filters of a layer of the DNN may use the same fixed point number format.

Since the second number format has reduced precision compared to the first number format, when a weight in the first number format is quantised to the second number format there will often be a quantisation error. Specifically, a weight $w$ in the first number format (e.g. floating point number format) may be expressed as the sum of the weight $w^q$ in the second number format (e.g. fixed point number format) and a quantisation error $w^e$ as shown in equation (3). If equation (3) is rearranged, the quantisation error $w^e$ can be expressed as the difference between the weight $w$ in the first number format (e.g. floating point number format) and the weight $w^q$ in the second number format (e.g. fixed point number format) as shown in equation (4). Accordingly, when the weight $w$ in the first number format (e.g. floating point number format) is greater than the weight $w^q$ in the second number format (e.g. fixed point number format) the quantisation error $w^e$ will be positive. In contrast, when the weight $w$ in the first number format (e.g. floating point number format) is less than the weight $w^q$ in the second number format (e.g. fixed point number format) the quantisation error $w^e$ will be negative. It will be evident to a person of skill in the art that this is an example way of defining the quantisation error and the quantisation error may be defined in another manner. For example, in other examples the quantisation error may be defined as the weight in the second number format less the weight in the first number format.

$$w = w^q + w^e \qquad (3)$$

$$w^e = w - w^q \qquad (4)$$

In some cases, determining the quantisation error associated with quantising a weight in the first number format to the second number format in accordance with a first quantisation method may comprise quantising the weight in the first number format to the second number format in accordance with the first quantisation method (e.g. in accordance with equation (2)) to generate a quantised weight and then determining the quantisation error from the quantised weight (e.g. in accordance with equation (4)).

However, in other cases the quantisation error associated with quantising a weight in the first number format to the second number can be determined without quantising the weight to the second number format. For example, in a simple case where the weights are positive fractions which are quantised by rounding to the nearest integer, the fraction bits of the weights can be analysed to determine the quantisation error. For example, a weight of 7.9 will have a quantisation error of 0.1, because quantising any value with a fractional part of 0.9 will result in a quantisation error of 0.1. Similarly, a weight of 3.2 will have a quantisation error of 0.2, and so on.

Once a quantisation error has been determined for each weight in the filter the method 400 proceeds to block 404.

At block 404, a total quantisation error for the filter is determined. In some cases, the total quantisation error for a filter filtererror is defined as the sum of the quantisation errors $w^e$ of the weights of the filter W as shown in equation (5) where $w_i^e$ is the quantisation error for the $i^{th}$ weight of the filter W, and R is the number of weights in the filter.

$$\text{filtererror} = \Sigma_{i=1}^{R} w_i^e \qquad (5)$$

Figure 2:
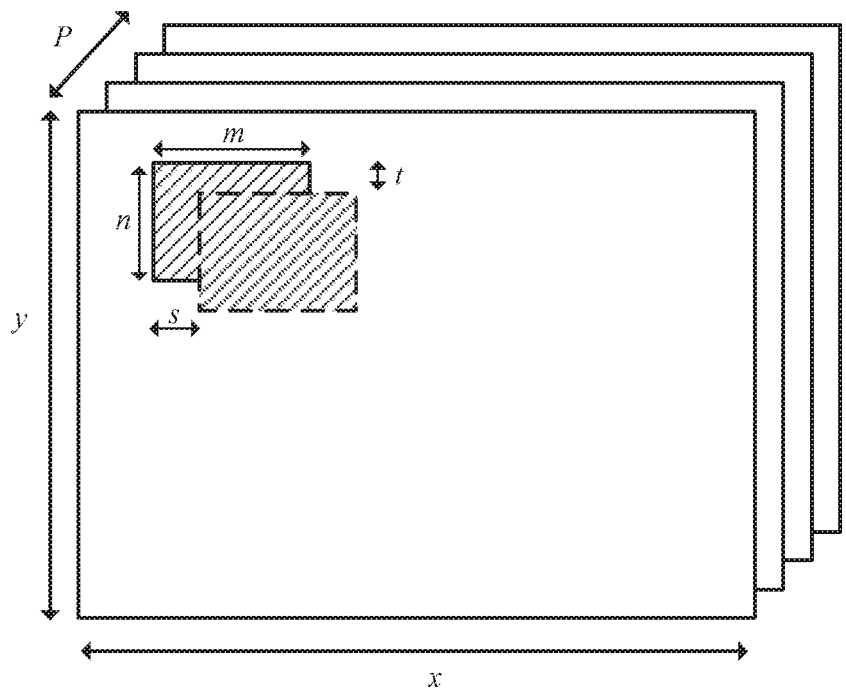
FIG. 2 is a schematic diagram of example data in a DNN.
Figure 3:
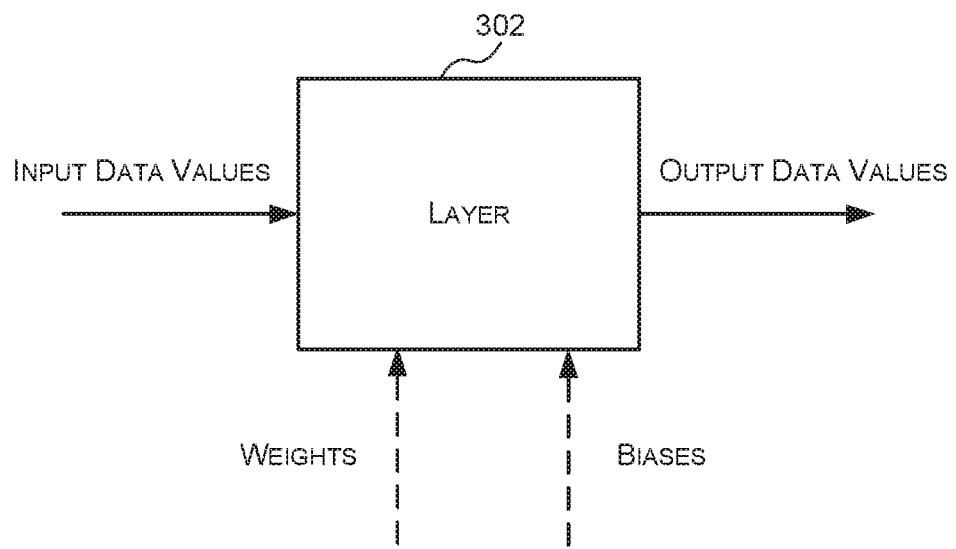
FIG. 3 is a schematic diagram illustrating the data input to, and output from, a layer of a DNN.

As described above, for each filter W of a convolution layer the output is generated by sliding the filter W across the input data X in directions x and y (FIG. 2) at predetermined step sizes s and t respectively. At each step the dot product (i.e. output value) a of the filter weights w and the input data values x that overlap, or align, with the filter (which are collectively referred to as a window of the input data) is calculated as shown in equation (6) where $w_i$ is the $i^{th}$ weight of the filter W and $x_i$ is the $i^{th}$ input value of the window, and R is the number of weights in the filter W.

$$a = \Sigma_{i=1}^{R} x_i w_i \qquad (6)$$

When the input data values x are also quantised from a higher precision number format to a lower precision number format there will also be a quantisation error associated with each input data value. Specifically, an input data value x in a first number format (e.g. floating point number format) may be expressed as the sum of the input data value $x^q$ in a second, lower precision, number format and a quantisation error $x^e$ as shown in equation (7).

$$x = x^q + x^e \qquad (7)$$

Accordingly, where both the input data values and the weights are quantised to lower precision formats (e.g. from floating point number formats to fixed point number formats), equation (6) can be written as equation (8) which can be expanded to equation (9). It can be seen from equation (10) that in these cases the error in the output value $a^e$ is $\Sigma_{i=1}^{R} x_i^e w_i^q + \Sigma_{i=1}^{R} x_i^q w_i^e + \Sigma_{i=1}^{R} x_i^e w_i^e$. Since $x = x^q + x^e$, $\Sigma_{i=1}^{R} x_i^q w_i^e + \Sigma_{i=1}^{R} x_i^e w_i^e$ is equal to $\Sigma_{i=1}^{R} x_i w_i^e$, the error in the output $a^e$ can be written as two terms as shown in equation (11).

$$a = \sum_{i=1}^{R} ((x_i^q + x_i^e) \cdot (w_i^q + w_i^e)) \quad (8)$$

$$a = \sum_{i=1}^{R} x_i^q w_i^q + \sum_{i=1}^{R} x_i^e w_i^q + \sum_{i=1}^{R} x_i^q w_i^e + \quad (9)$$
$$\sum_{i=1}^{R} x_i^e w_i^e$$
$$= \sum_{i=1}^{R} x_i^q w_i^q + a^e$$
$$= a^q + a^e$$

$$a^e = \sum_{i=1}^{R} x_i^e w_i^q + \sum_{i=1}^{R} x_i^q w_i^e + \sum_{i=1}^{R} x_i^e w_i^e \quad (10)$$

$$a^e = \sum_{i=1}^{R} x_i^e w_i^q + \sum_{i=1}^{R} x_i w_i^e \quad (11)$$

In many cases $\Sigma_{i=1}^{R} x_i w_i^e$ is the dominant error term of equation (11) and thus the error $a^e$ in an output value a can be reduced by reducing $|\Sigma_{i=1}^{R} x_i w_i^e|$. Where the mean of the input data values is non-zero or the absolute expected value of the input data values is greater than the absolute expected value of input quantisation error, the dominant error term $\Sigma_{i=1}^{R} x_i w_i^e$ can be reduced by decreasing the total quantisation error for the filter W filtererror. The input data to a convolution layer frequently has a non-zero mean because convolution layers are often, but not necessarily, preceded by an activation layer that applies a ReLU function to the input data of a convolution layer before it is provided to the convolution layer. As described above a ReLU function outputs the greater of 0 and the input. As a result, the output of a ReLU function will be greater than or equal to zero.

Once the total quantisation error for the filter filtererror has been determined the method 400 proceeds to block 406.

At block 406, a subset of the plurality of weights to quantise to the second number format in accordance with a second, different, quantisation method to minimise the total quantisation error for the filter filtererror are identified from the total quantisation error filtererror. The term subset is used herein to mean only a part of a larger group of things. Therefore a subset of the weights of the filter comprises only a portion of the weights of the filter.

In some cases, the second quantisation method is configured to change the direction of rounding for a particular weight relative to the first quantisation method so that if quantising a weight in accordance with the first quantisation method produces a quantisation error with a first sign then quantising the same weight in accordance with the second quantisation method produces a quantisation error with a second, different, sign. For example, a weight that is rounded up (i.e. quantised to a higher value $-x^q>x$) in accordance with the first quantisation method may be rounded down (i.e. quantised to a lower value $-x^q<x$) in accordance with the second quantisation method, and a weight that is rounded down (i.e. quantised to a lower value $-x^q<x$) in accordance with the first quantisation method may be rounded up (i.e. quantised to a higher value $-x^q>x$) in accordance with the second quantisation method.

Where the total quantisation error for the filter filtererror is equal to the sum of the quantisation errors for the weights of the filter as shown in equation (5) and the quantisation errors may be negative or positive, the total quantisation error filtererror will be zero if the sum of the negative quantisation errors is equal to the sum of the positive quantisation errors. Accordingly, in these cases, the total quantisation error for the filter filtererror can be driven to zero (or substantially zero) by making the total negative quantisation errors equal (or substantially equal) to the total positive quantisation errors. Where the total quantisation error for the filter filtererror is positive this means decreasing the total positive quantisation errors and increasing the total negative quantisation errors. Conversely, where the total quantisation error for the filter filtererror is negative this means increasing the total positive quantisation errors and decreasing the total negative quantisation errors.

This can be done by effectively flipping or reversing the sign of a number of the quantisation errors. Where the original weight (the weight w in the first number format (e.g. floating point number format)) is half way between the two closest representable numbers in the second number format (e.g. fixed point number format) the sign of the quantisation error can be flipped or reversed by rounding the weight in the floating point number format in the opposite direction (e.g. instead of rounding down, rounding up). Where the first quantisation method is the round to nearest rounding method this is the same as rounding the weight to the next nearest representable number. For example, if the second number format is a fixed point number format that can represent numbers 0, 2, 4, 6 etc. then the number 2.9 will be rounded down to 2 if the round to nearest rounding mode is used as 2 is the closest or nearest representable number in the second number format. In this case the quantisation error, according to equation (4) will be 0.9 (i.e. 2.9-2). If the number 2.9 is rounded in the opposite direction (i.e. up instead of down), which is equivalent to rounding 2.9 to the next nearest representable number, it is rounded up to 4. In this case the quantisation error, according to equation (4), will be −1.1 (i.e. 2.9-4). Thus rounding a number that is close to the halfway point between the two closest representable numbers in the opposite direction effectively reverses the sign of the quantisation error. The magnitude of the quantisation error may not be identical when the rounding direction is reversed, but the closer the original weight w in the first number format (e.g. floating point number format) is to the halfway point between the two closest representable numbers the closer the two quantisation errors will be.

The weights in the filter W that are equal to, or close to, the half way point between the two closest representable numbers in the second number format (e.g. fixed point number format) will have a quantisation error that is roughly half of the distance between representable numbers (e.g. step size) of the fixed point number format. For example, where the second number format is a fixed point number format defined by a mantissa bit length and an exponent exp the distance between representable numbers will be $2^{exp}$. Therefore the weights that are equal to, or close to, the halfway point between the two closest representable numbers will have a quantisation error roughly equal to $$\frac{2^{exp}}{2}.$$

Accordingly, the total quantisation error for the filter can be divided into K of these quantisation errors as set forth in equation (12):

$$K = \frac{|filtererror|}{\left(\frac{2^{exp}}{2}\right)} = \frac{2|filtererror|}{2^{exp}} \quad (12)$$

The total quantisation error for the filter filtererror can then be zeroed (or substantially zeroed) by reversing the sign of half of these quantisation errors. Accordingly, the total quantisation error for the filter filtererror can be zeroed (or substantially zeroed) by reversing the sign of N quantisation errors (or in other words, by rounding N weights in the other direction) where N is K/2 as set forth in equation (13).

$$N = \frac{K}{2} = \frac{|filtererror|}{2^{exp}} \qquad (13)$$

Accordingly, in some cases, where the total quantisation error is positive, the subset of weights to be quantised to the second number format in accordance with the second quantisation method may include the N weights with a positive quantisation error closest to half the distance between representable numbers in the second number format (i.e. half of $2^{exp}$) and are not saturated. In some cases, these N weights may be identified by sorting the weights with a positive quantisation error based on how close their quantisation error is to half the distance between representable numbers in the second number format (i.e. half of $2^{exp}$) and selecting the top N weights from the sorted list. Where the first quantisation method is the round to nearest rounding method these N weights will be the N weights with the largest positive quantisation error.

Similarly, where the total quantisation error is negative, the subset of weights to be quantised to the second number format in accordance with the second quantisation method may include the N weights with a negative quantisation error closest to half the distance between representable numbers in the second number format (i.e. half of $2^{exp}$) and are not saturated. In some cases, these N weights may be identified by sorting the weights with a negative quantisation error based on how close the magnitude of the quantisation error is to half the distance between representable numbers in the second number format (i.e. half of $2^{exp}$) and selecting the top N weights from the sorted list. Where the first quantisation method is the round to nearest rounding method these N weights will be the N weights with the largest negative quantisation error.

However, in other cases the specific weights of the filter that are selected for quantisation in accordance with the second quantisation method may be selected in another way. For example, as described in more detail below, in some cases all, or at least a plurality, of the filters for a layer may be quantised together and the interactions between filters of the same layer may be taken into account when selecting which weights of each filter are to be quantised to the second number format in accordance with a second quantisation method.

Once the subset of the plurality of weights to be quantised to the second number format in accordance with the second quantisation method has been determined, the method 400 proceeds to block 408.

Figure 6:
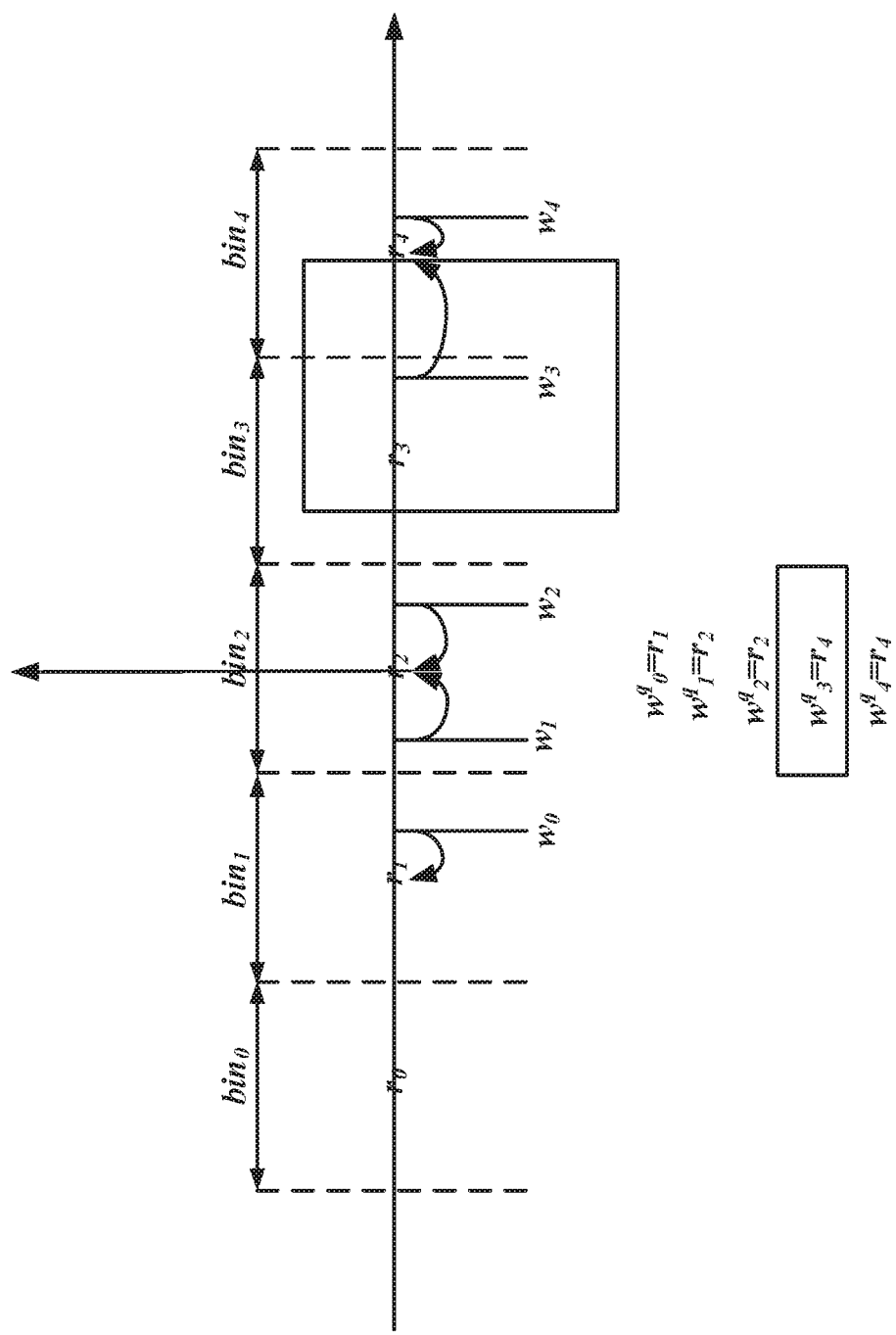
FIG. 6 is a schematic diagram illustrating replacing an example quantised weight with the next representable number in a fixed point number format.

At block 408, a set of quantised weights representing the weights of the filter in the second number format is generated such that the quantised weight for each weight in the subset is based on quantising that weight to the second number format in accordance with the second quantisation method, and the quantised weight for each of the remaining weights of the filter is based on quantising that weight to the second number format in accordance with the first quantisation method. It is expected that the total quantisation error for this set of quantised weights is closer to zero than the total quantisation error determined in block 404.

Where the weights of the filter were quantised to the second number format in accordance with the first quantisation method in block 402, the set of quantised weights representing the weights of the filter in the second number format may be generated by taking the quantised weights and replacing each of the quantised weights corresponding to a weight in the subset with the next representable number in the second number format (e.g. fixed point number format) in a predetermined direction (i.e. up or down) so as to reverse the sign of the quantisation error for those weights. For example, if, as shown in FIGS. 5 and 6, the fourth weight $w_3$ was quantised in block 402 to the fourth representable number $r_3$ on the basis that the fourth weight $w_3$ fell within the fourth bin $bin_3$. If the fourth quantised weight $w_3^q$ is in the subset identified in block 406 the fourth quantised weight $w_3^q$ may be replaced with the next representable number in the second number format i.e. the fifth representable number $r_4$.

The predetermined direction is based on whether the objective is to flip negative quantisation errors to positive quantisation errors or vice versa. For example, if equation (4) is used to determine whether a quantisation error is positive or negative then a quantisation error will be positive if the weight in the second number format (e.g. fixed point number format) is less than the weight in the first number format (e.g. floating point number format) (i.e. if the weight is rounded down), and the quantisation error will be negative if the weight in the second number format (e.g. fixed point number format) is larger than the weight in the floating point number format (i.e. if the weight is rounded up).

Accordingly, in this example, to cause a positive quantisation error to become a negative quantisation error the quantised weight is replaced with the next highest representable number in the second number format (e.g. fixed point number format). For example, if the second number format is a fixed point number format that can represent numbers 0, 2, 4, 6 etc. and a round to nearest rounding mode is used, then a weight of 2.9 will be quantised down to 2. This results in a positive quantisation error of 0.9 (=2.9-2). If the quantised weight 2 is replaced with the next highest representable number in the fixed point number format, which is 4 in this example, this results in a negative quantisation error of −1.1 (=2.9-4).

Conversely, to cause a negative quantisation error to become a positive quantisation error the quantised weight is replaced with the next lowest representable number in the fixed point number format. For example, if the second number format is a fixed point number format that can represent numbers 0, 2, 4, 6 etc. and the round to nearest rounding mode is used a weight of 1.1 will be quantised up to 2. This results in a negative quantisation error of −0.9 (=1.1-2). If the quantised weight 2 is replaced with the next lowest representable number in the fixed point number format, which is 0 in this example, this results in a positive quantisation error of 1.1 (=1.1-0).

In some cases, replacing a quantised weight with the next representable number may be implemented by selected the next representable number in the predetermined direction and replacing the quantised weight $w^q$ with this number to generate an adjusted quantised weight $w^a$. In other cases, replacing a quantised weight $w_i^q$ with the next representable number in the fixed point number format may be implemented by adding a delta $\delta_i$ to the weight $w_i$ in the first number format to move the weight to the next highest or next lowest quantisation bin and then quantising according to the first quantisation method (e.g. quantising to the nearest representable number) as shown in equation (14) wherein $$\frac{2^{exp}}{2} \geq \delta_{1,[j]} \geq \frac{-2^{exp}}{2}$$

and exp is the exponent of the second number format. The delta $\delta_i$ is selected based on the sign of the total quantisation error for the filter filtererror and the first quantisation method. In some cases, as described below, where multiple filters in the same layer are quantised together the delta $\delta_i$ may also be based on the interaction between related filters. In some cases, all of the weights in the first number format may be re-quantised in accordance with equation (14), however, for those weights that are not in the subset identified in block 406 the delta $\delta_i$ may be set to zero.

$$w_i^a = RND(w_i + \delta_i) \qquad (14)$$

For example, where the first quantisation method is the round to nearest rounding method and equation (4) is used to determine whether a quantisation error is positive or negative, half a step size of the second number format (e.g. fixed point number format) may be added to a weight in the first number format (e.g. floating point number format) to move the weight to the next highest quantisation bin to cause a positive quantisation error to become a negative quantisation error. In contrast, half a step size may be subtracted from a weight in the first number format (e.g. floating point number format) to move the weight to the next lowest quantisation bin to cause a negative quantisation error to become a positive quantisation error.

Where, however, the weights of the filter were not quantised to the second number format in accordance with the first quantisation method in block 402, generating the set of weights may comprise quantising each weight of the subset to the second number format in accordance with the second quantisation method and quantising each remaining weight of the filter to the second number format in accordance with the first quantisation method. As described above, quantising a weight to the second number format in accordance with the first quantisation method may comprise quantising that weight to the second number format in accordance with equation (2) for a particular rounding mode (e.g. round to nearest).

As described above, the second quantisation method may be configured to quantise a weight in the opposite direction as the first quantisation method. For example, if a weight is rounded up when quantised in accordance with the first quantisation method that weight may be rounded down when quantised in accordance with the second quantisation method, and if a weight is rounded down when quantised in accordance with the first quantisation method that weight may be rounded up when quantised in accordance with the second quantisation method. In other words, if the first quantisation method will quantise a weight to a first representable number in the second number format then the second quantisation method will quantise that weight to a second representable number in the second number format wherein the second representable number is the next representable number relative to the first representable number in a predetermined direction. The predetermined direction may be selected as described above with respect to replacing a quantized weight. For example, the predetermined direction may be selected based on whether the objective is to flip negative quantisation errors to positive quantisation errors or vice versa.

In some cases, quantising a weight to the second number format in accordance with the second quantisation method comprises adding a delta $\delta_i$ to the weight to generate a modified weight and quantising the modified weight in accordance with the first quantisation method. The delta may be selected in the same manner as described above with respect to replacing a quantised weight such that the modified weight falls in the next quantisation bin in a predetermined direction.

Once the set of quantised weights representing the weights of the filter in the second number format has been generated the method 400 ends.

In some cases, blocks 406 and 408 may only be performed if the total quantisation error for the filter is greater than an error threshold. In other words, in some cases blocks 406 and 408 may not be performed if the total quantisation error for the filter is less than or equal to an error threshold.

The effectiveness of the method 400 of FIG. 4 at zeroing the total quantisation error of a filter filtererror is based on the magnitude of the quantisation errors of the weights in the subset. Specifically, the number N is selected on the basis that there are N weights wherein the magnitude of the quantisation error will be substantially the same when rounded up or rounded down. This will occur when the weight w in the first number format (e.g. floating point number format) is halfway between the two closest representable numbers in the second number format (e.g. fixed point number format).

For example, when a weight w in the first number format (e.g. floating point number format) is quantised to the nearest representable number $w_{nearest}^q$ in the second number format (e.g. fixed point number format) the quantisation error $w_{nearest}^e$ will be equal to half the step size $$\left(\frac{2^{exp}}{2}\right)$$

of the fixed point number format less a delta $\Delta$ as shown in equation (15), wherein the delta $\Delta$ is the difference between the weight w in the first number format (e.g. floating point number format) and the half way point between the two closet representable numbers as shown in equation (16). In contrast, when a weight w in the first number format (e.g. floating point number format) is quantised to the next nearest representable number $w_{next\_nearest}^q$ the quantisation error $w_{next\_nearest}^e$ will be half a step size plus the delta $\Delta$ as shown in equation (17). Thus the quantisation errors $w_{nearest}^e$ and $w_{next\_nearest}^e$ will only have the same magnitude (i.e. half a step size) when the delta $\Delta$ is zero.

$$|w_{nearest}^e| = \frac{2^{exp}}{2} - \Delta \qquad (15)$$

$$\Delta = w_{nearest}^q + \frac{2^{exp}}{2} - w \qquad (16)$$

$$|w_{next\_nearest}^e| = \frac{2^{exp}}{2} + \Delta \qquad (17)$$

Accordingly, the further a weight w in the first number format (e.g. floating point number format) is from the half-way point between the two closest representable numbers in the second number format (e.g. fixed point number format), the more the quantisation error magnitude will increase when the sign of the quantisation error is reversed (i.e. when the weight is quantised to the next highest or next lowest representable number). As a result, quantising N weights in accordance with the second quantisation method may push the total quantisation error of the filter filtererror in the other direction. For example, if the total quantisation error of the filter filtererror was positive when all of the weights were quantised to the second number format in accordance with the first quantisation method, quantising some of the weights in accordance with the second quantisation method may cause the total quantisation error of the filter filtererror to be negative. Accordingly, in some cases, blocks 404 and 406 may be repeated if the total quantisation error for the filter filtererror has not dropped below a predetermined error threshold ϵ. More specifically, in some cases if quantising a subset of weights in accordance with the second quantisation method does not drop the total quantisation error for the filter below an error threshold then another subset of weights may be selected to be quantised in accordance with the second quantisation method or another quantisation method.

Figure 7:
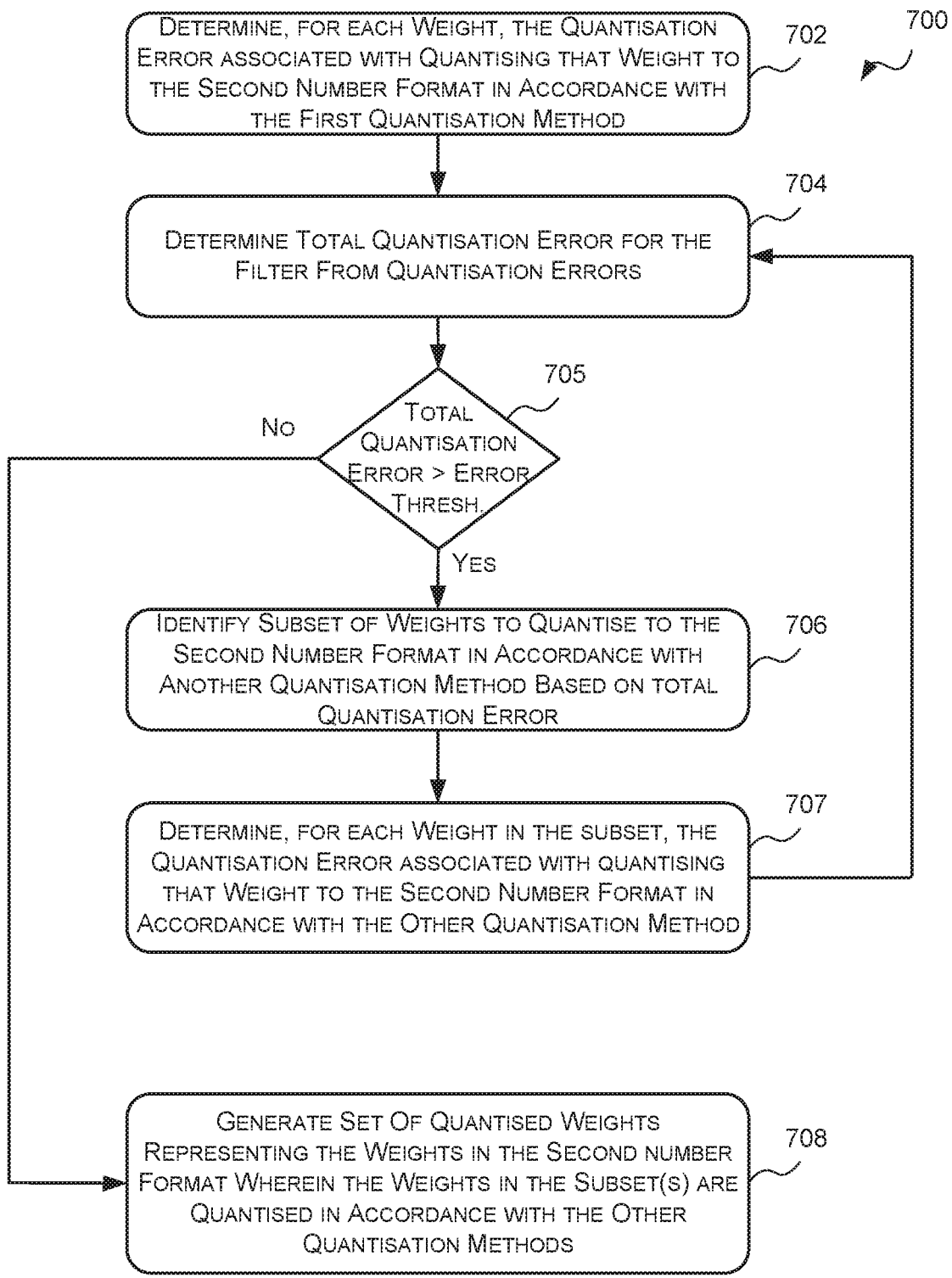
FIG. 7 is a flow diagram of a second example method of converting weights of a DNN filter from a first number format to a second, lower precision, number format.

Reference is now made to FIG. 7 which illustrates an iterative method 700 for quantising the weights w of a DNN filter W from a first number format to a second, lower precision, number format. The second number format is a fixed point number format, but the first number format may be a floating point number format or a fixed point number format. The method 700 may be implemented by a computing-based device such as the computing-based device 1700 described below with respect to FIG. 17. For example, there may be computer readable storage medium having stored thereon computer readable instructions that, when executed at a computing-based device, cause the computing-based device to perform the method 700 of FIG. 7.

The method 700 begins at block 702. Block 702 generally corresponds to block 402 of the method 400 of FIG. 4 where, for each weight of the filter, the quantisation error associated with quantising that weight to the second number format in accordance with the first quantisation method is determined. The quantisation error for a weight may be determined by quantising the weight to the second number format in accordance with the first quantisation method (e.g. in accordance with equation (2)) to generate a quantised weight, and determining the quantisation error from the quantised weight (e.g. in accordance with equation 4)); or the quantisation error for a weight may be determined without quantising the weight to the second number format in accordance with the first quantisation method (e.g. based on an analysis of the weight). Once the quantisation errors have been determined the method 700 proceeds to block 704.

At block 704, which generally corresponds to block 404 of the method 400 of FIG. 4, the total quantisation error for the filter filtererror is determined from the relevant quantisation errors for the weights of the filter. In some cases, the total quantisation error for the filter may be calculated as the sum of the relevant quantisation errors for the weights of the filter. In the first iteration, the relevant quantisation errors are the quantisation errors determined in block 702. Specifically, in the first iteration the total quantisation error for the filter filtererror is based on the quantisation errors associated with quantising each of the weights to the second number format in accordance with the first quantisation method. However, in subsequent iterations the relevant quantisation errors are the quantisation errors determined in block 707 for the weights in the subset(s) and the quantisation errors determined in block 702 for the remaining weights of the filter. Specifically, in subsequent iterations the total quantisation error for the filter filtererror is based on quantising each weight in a subset to the second number format in accordance with the quantisation method associated with that subset (e.g. the second quantisation method or another quantisation method) and quantising the remaining weights of the filter (i.e. those not in a subset) in accordance with the first quantisation method. Once the total quantisation error for the filter has been determined the method 700 proceeds to block 705.

At block 705, a determination is made as to whether the total quantisation error for the filter filtererror is greater than an error threshold ϵ. If it is determined that the total quantisation error for the filter filtererror is greater than the error threshold E then the method 700 proceeds to blocks 706 and 707. If, however, it is determined that the total quantisation error for the filter filtererror is less than or equal to the error threshold E then the method 700 proceeds to block 708.

At block 706, which generally corresponds to block 406 of the method 400 of FIG. 4, a subset of the weights of the filter to be quantised to the second number format in accordance with another quantisation method is identified based on the total quantisation error for the filter filtererror. Any of the methods described above in relation to block 406 for identifying a subset of weights based on the total quantisation error may be used. For example, the subset of weights may be identified based on the sign of the total quantisation error, the magnitude of the total quantisation error, the first quantisation method and the quantisation errors for the weights.

In the first iteration, block 706 may be used to identify weights to be quantised to the second number format in accordance with the second quantisation method. In subsequent iterations, block 706 may be used to identify weights to be quantisation to the second number format in accordance with the second quantisation method or another quantisation method. For example, if the first total quantisation error is negative then the first iteration of block 706 may identify a subset of weights with a negative quantisation error to be flipped to a positive quantisation error. If this causes the total quantisation error for the filter to become positive, then the second iteration of block 706 may identify a different subset of weights with a positive quantisation error to be flipped to a negative quantisation error. Once the subset of weights has been identified the method 700 proceeds to block 707.

At block 707, for each weight in the subset identified in block 706, the quantisation error associated with quantising that weight to the second number format in accordance with the quantisation method associated with that subset is determined. For example, where the subset is associated with the second quantisation method then the quantisation error associated with quantising each weight in the subset to the second number format in accordance with the second quantisation method is determined. As with block 702, a quantisation error for a weight in a subset may be determined by quantising that weight to the second number format in accordance with the quantisation method associated with the subset to generate a quantised weight and determining the quantisation error from the quantised weight; or the quantisation error may be determined without quantising the weight. Once the quantisation errors have been determined the method 700 then proceeds back to block 704 where the total quantisation error is determined.

At block 708, which generally corresponds to block 408 of the method 400 of FIG. 4, a set of quantised weights representing the weights in the second number format is generated wherein the quantised weight for each weight in a subset is based on quantising that weight to the second number format in accordance with the other quantisation method associated with that subset, and the quantised weights for all of the remaining weights (those not forming part of a subset) are based on quantising those weights to the second number format in accordance with the first quantisation method.

Although the methods 400 and 700 of FIGS. 4 and 7 are described as being used to convert the weights of a DNN filter from a first number format to a second, lower precision, number format on a per filter basis, in other cases the weights of a filter may be sub-divided into a plurality of non-overlapping subsets of weights and the method 400 of FIG. 4 or the method 700 of FIG. 7 may be performed for each non-overlapping subset of weights. In these cases, instead of determining the total quantisation error for the filter, the total quantisation error for the weights in the subset is determined.

Figure 8:
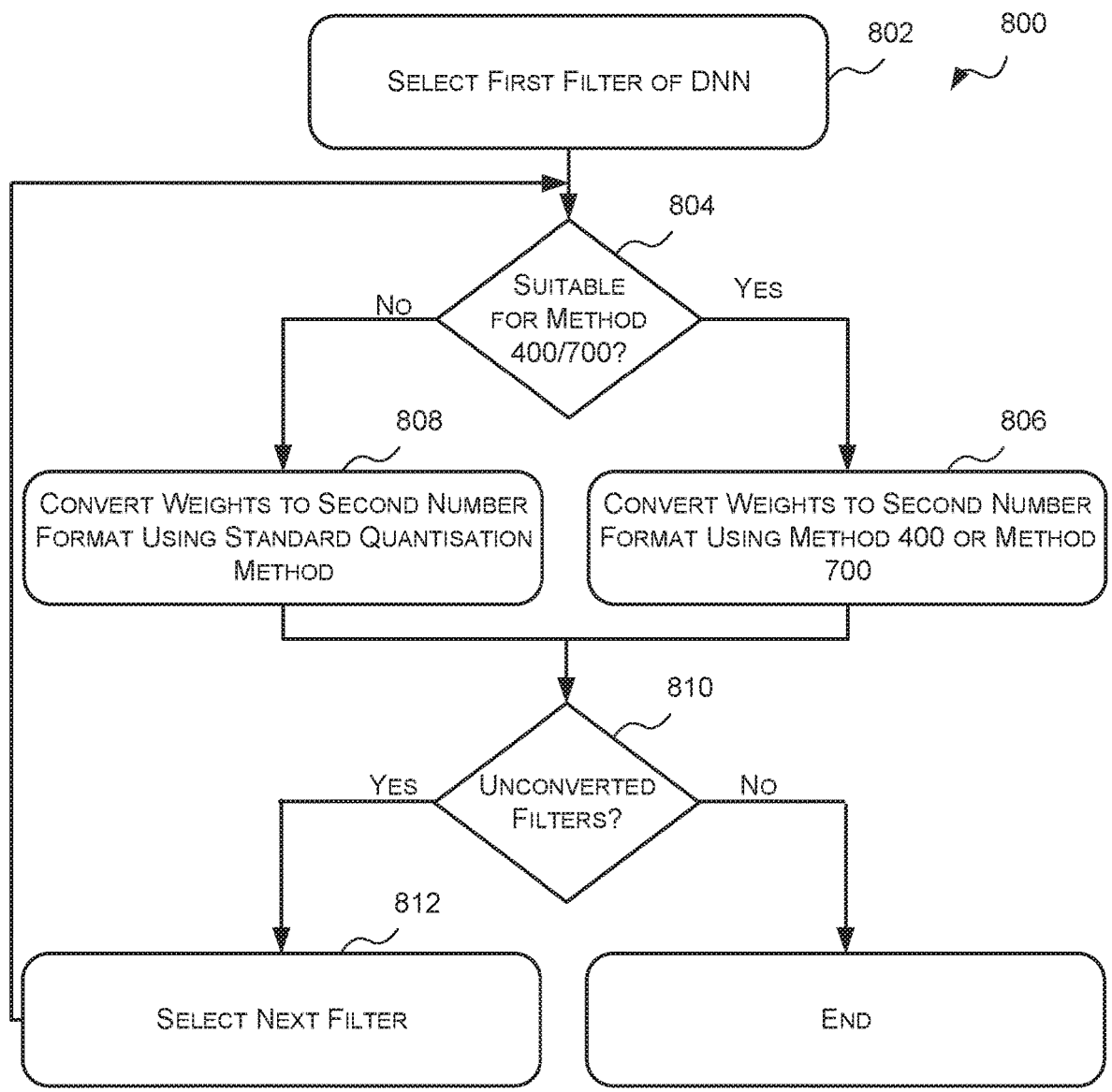
FIG. 8 is a flow diagram of an example method of converting weights of a DNN from a first set of number formats to a second set of number formats.

Reference is now made to FIG. 8 which illustrates a method 800 of converting the weights of a DNN from a first set of number formats to a second set of number formats so as to be able to implement the DNN in hardware logic. The second set of number formats are fixed point number formats and the first set of number formats may be fixed point number formats or floating point number formats. Each filter is associated with a first number format and a second number format. Depending on the configuration of the hardware logic, which is to implement the DNN, all the filters of the same DNN layer may have the same second number format or different filters of the same DNN layer may have different second number formats. For example, some hardware logic (e.g. DNN accelerators) that can be configured to implement a DNN may be able to process filters of the same layer using different fixed point number formats whereas other hardware logic (e.g. DNN accelerators) that can be configured to implement a DNN may only be able process filters of the same layer with the same fixed point number format.

The method 800 may be implemented by a computing-based device such as the computing-based device 1700 described below with respect to FIG. 17. For example, there may be computer readable storage medium having stored thereon computer readable instructions that, when executed at a computing-based device, cause the computing-based device to perform the method 800 of FIG. 8.

The method 800 begins at block 802 where a first filter of the plurality of filters of the DNN is selected as the current filter for conversion. The first filter may be selected from the plurality of filters in any suitable manner. In some cases, all of the filters associated with a layer are converted before the filters associated with a different layer are converted. Once the first filter of the plurality of filters has been selected the method 800 proceeds to block 804.

At block 804, a determination is made as to whether the filter is suitable for conversion using the method 400 of FIG. 4 or the method 700 of FIG. 7. A filter may be deemed suitable for conversion using the method 400 of FIG. 4 or the method 700 of FIG. 7 if the expected value (or mean) of the inputs to the layer to which the filter is associated is non-zero (i.e. E(x)≠0). In other words, a filter may be deemed not suitable for conversion using the method 400 of FIG. 4 or the method 700 of FIG. 7 if the expected values of the inputs to the layer to which the filter is associated is substantially zero (i.e. E(x)≈0). As described above, the input data to a layer may have a non-zero mean (i.e. an expected value that is non-zero) if it is preceded by, for example, an activation layer that implements a ReLU, PReLU or LeakyReLU function.

If it has been determined that the filter is suitable for conversion using the method 400 of FIG. 4 or the method 700 of FIG. 7 then the method 800 proceeds to block 806 where the method 400 of FIG. 4 or the method 700 of FIG. 7 is used to convert the weights of the filter in a first number format to a second number format for the filter. If, however, it has been determined that the filter is not suitable for conversion using the method 400 of FIG. 4 or the method 700 of FIG. 7 then the method 800 proceeds to block 808 where the weights of the filter are converted from the first number format to the second number format for the filter using another method. For example, the weights of the filter may be quantised using a standard quantisation method such as round to nearest. After the weights of the current filter have been converted at block 806 or block 808 the method proceeds to block 810.

At block 810, a determination is made as to whether there are any un-converted filters of the DNN. If there is at least one un-converted filter, then the method 800 proceeds to block 812 where one of the un-converted filters is selected to be the current filter for conversion and then the method 800 proceeds back to block 804. If, however, it is determined that all of the filters of the DNN have been converted the method 800 ends.

In some cases, multiple filters of the same layer may be converted from first fixed point format(s) to second fixed point format(s) at the same time, or in conjunction with each other, so that interactions between the filters of the same layer can be taken advantage of. In these cases, the quantisation error associated with quantising the weights of each filter to the second number format for that filter in accordance with a first quantisation method as described above with respect to block 402, and the total quantisation error for each filter may be determined as described above with respect to block 404. However, the subset of weights of each filter that are to be quantised to the second number format for that filter in accordance with the second quantisation method may be based on both the total quantisation error for the filter and the interactions between the plurality of filters. Specifically, each filter for a layer will be of the same dimensions and the $i^{th}$ weight of each filter will be applied to the same input data values. Accordingly, the weights of the filters to be quantised to the second number format in accordance with the second quantisation method may be selected so that the selected weights are distributed across different weights of the filters. For example, the weights of the filters may be selected so that if the $i^{th}$ weight of a first filter of a layer belongs to a subset that is quantised to the second number format in a first direction (e.g. the positive direction) that the $i^{th}$ weight of a second filter of the layer does not belong to a subset that is quantised to the second number format in the same direction. Accordingly, if the $i^{th}$ weight of a first filter of a layer is selected, in accordance with block 406, to be rounded up instead of down, and the $i^{th}$ weight of a second filter of the layer is selected to be rounded up instead of down in accordance with block 406, then another weight of the second filter may be selected to be rounded up instead of the $i^{th}$ weight. If, however, the $i^{th}$ weight of the second filter of the layer is selected to be rounded down instead of up in accordance with block 406, then the $i^{th}$ weight of the second filter may remain in the subset of weights of that filter.

Test Results

Figure 9:
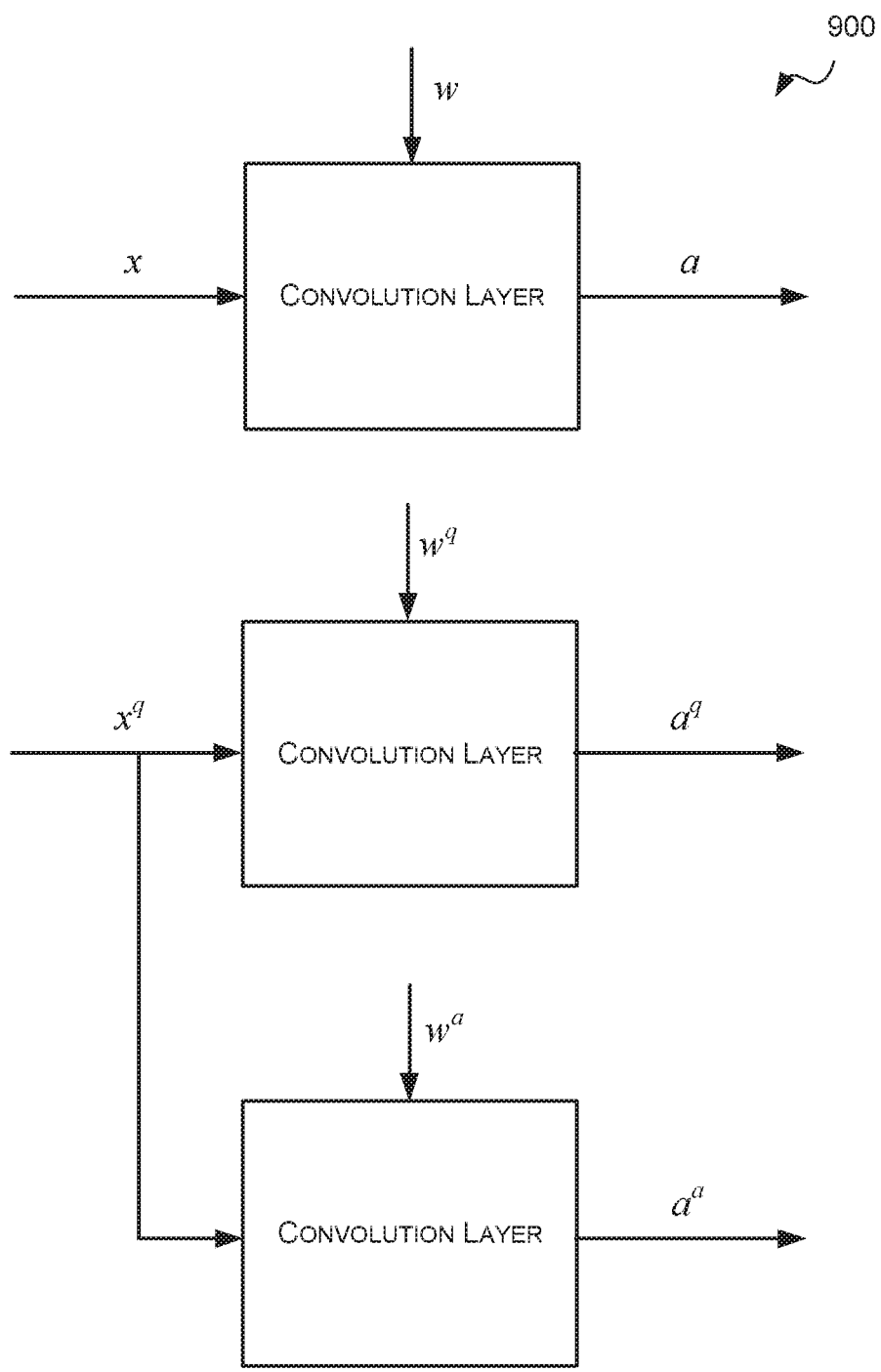
FIG. 9 is a schematic diagram of a test environment in which the method of FIG. 4 was tested.

Reference is now made to FIG. 9 which illustrates an example test environment 900 in which the method 400 of FIG. 4 was tested. In this test environment a 256×256×256 set of floating point input values (x) were convolved with stride 1×1 with each of 256 3×3×256 filters of floating point weights (w) to generate floating point output values (a). Then the input values (x) were quantised to a fixed point number format defined by a bit width of 4 and an exponent of −1 according to the round to nearest rounding method to generate quantised input values ($x^q$), the weights (w) were quantised to a fixed point number format defined by a bit width of 4 and an exponent of −2 according to the round to nearest rounding method to generate quantised weights ($w^q$) and the quantised input values ($x^q$) and weights ($w^q$) were convolved with stride 1×1 to generate quantized output values ($a^q$). A set of quantised weights ($w^a$) in the fixed point format were then generated according to the method 400 of FIG. 4, which may be referred to herein as the adjusted weights. Then the quantised input values ($x^q$) and the adjusted weights ($w^a$) were convolved with stride 1×1 to generate adjusted output values ($a^a$).

The absolute quantisation error ($error^q$) between each floating point output (a) and the corresponding quantised output ($a^q$) was determined as set out in equation (18), and the absolute quantisation error ($error^a$) between each floating point output (a) and the corresponding adjusted output ($a^a$) was determined as set out in equation (19). Then the mean and maximum (or peak) absolute quantisation errors were determined on a per filter basis for each quantisation method (i.e. round to nearest, and the quantisation method set out in method 400 of FIG. 4 where round to nearest is the first quantisation method) as shown in equations (20), (21), (22), and (23).

$$error^q = |a - a^q| \quad (18)$$

$$error^a = |a - a^a| \quad (19)$$

$$E^q = \text{mean}\{error^q\} \quad (20)$$

$$E^a = \text{mean}\{error^a\} \quad (21)$$

$$M^q = \text{maximum}\{error^q\} \quad (22)$$

$$M^a = \text{maximum}\{error^a\} \quad (23)$$

Figure 10:
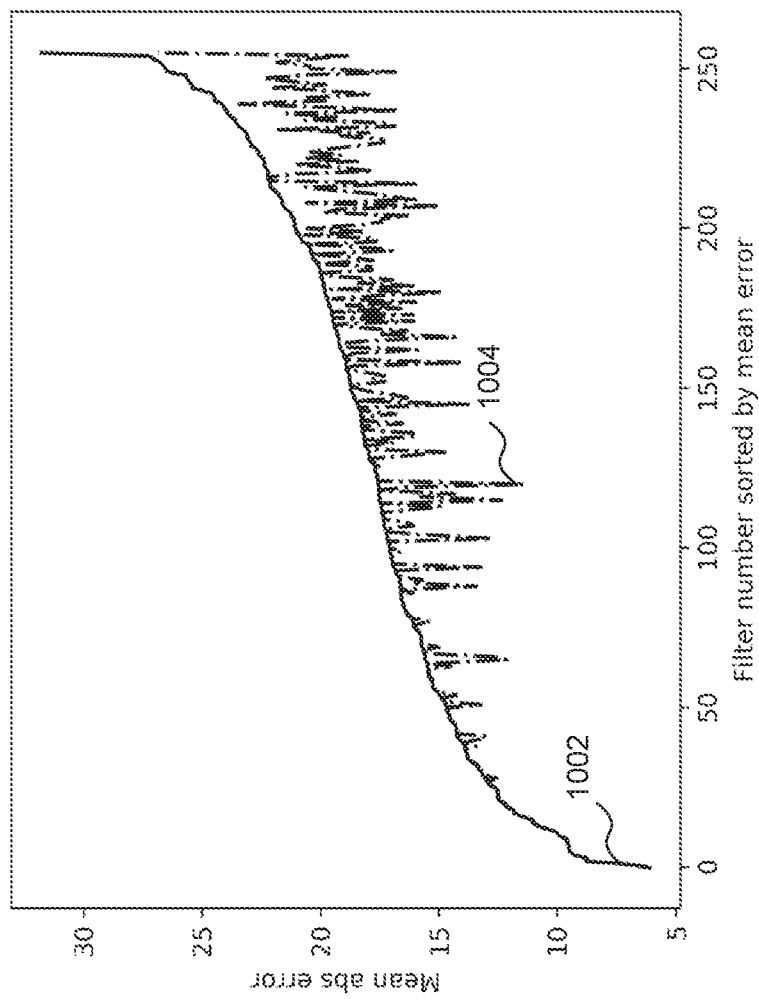
FIG. 10 is a graph illustrating the mean per filter quantisation error for a first example convolution layer when the weights are quantised to a fixed point number format according to a standard quantisation method, and when the weights are quantised to the fixed point number format according to the method of FIG. 4.
Figure 11:
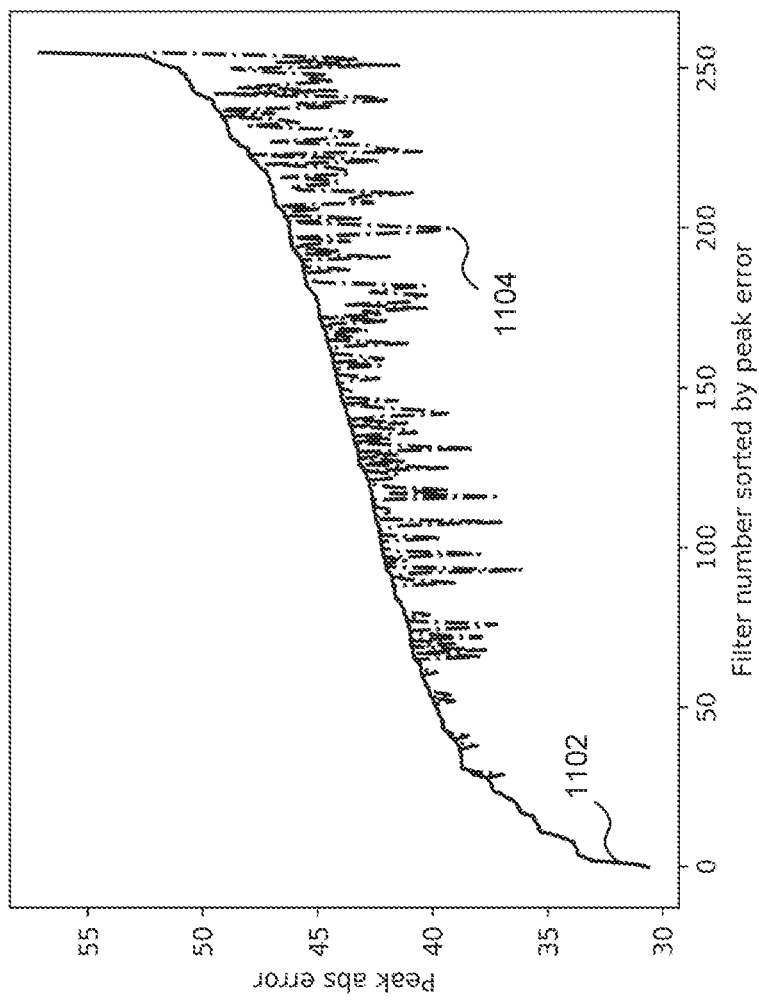
FIG. 11 is a graph illustrating the maximum per filter quantisation error for the first example convolution layer when the weights are quantised to a fixed point number format according to a standard quantisation method, and when the weights are quantised to the fixed point number format according to the method of FIG. 4.
Figure 12:
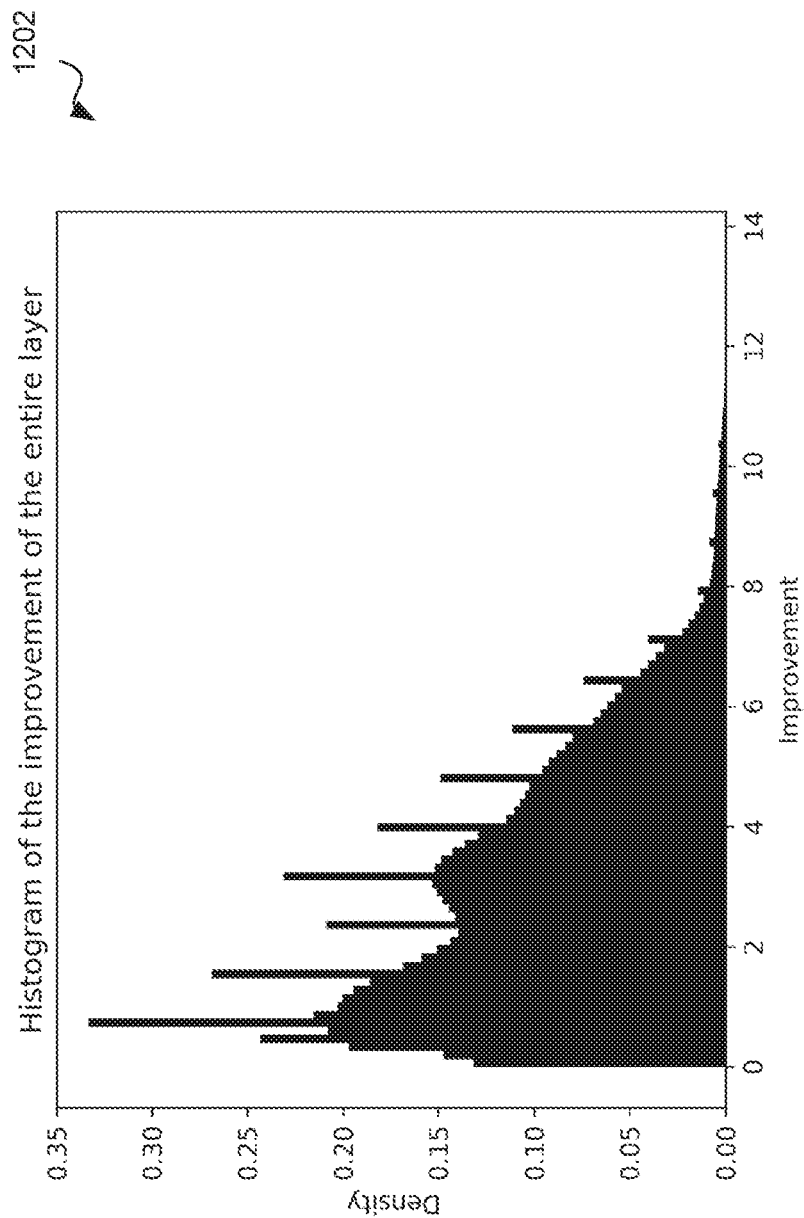
FIG. 12 is a density histogram illustrating the improvement in the per output quantisation error for the first example convolution layer achieved by quantising the weights according to the method of FIG. 4.

Reference is now made to FIGS. 10-12 which show graphs illustrating the improvement in the error in the output by quantising the weights in accordance with the method 400 of FIG. 4 compared to quantising the weights in accordance with the round to nearest rounding mode in a first example test scenario where the input values were uniform random numbers in the set [0, 4) and the weights were uniform random numbers in the set (−1, 1). Specifically, FIG. 10 shows graphs 1002, 1004 of the mean absolute quantisation errors $E^q$ and $E^a$ for each filter respectively, FIG. 11 shows graphs 1102, 1104 of the peak (or maximum) absolute quantisation errors $M^q$ and $M^a$ for each filter respectively, and FIG. 12 shows a density histogram 1202 of the improvement in the per output quantisation error (i.e. $error^q - error^a$) over the entire layer (i.e. for all the outputs). As is known to those of skill in the art, a density histogram is a histogram in which the area of each rectangle equals the relative frequency of the corresponding class/bin and the area of the entire histogram equals 1. Accordingly, in the density histogram 1202 of FIG. 12 each bin corresponds to a particular range of per output quantisation error improvements and the density of each bin is equal to the number of outputs which have an improvement in the quantisation error that falls within that bin divided by the bin width x total number of outputs.

As described above, convolving a filter with input data comprises calculating the dot product of the weights and each of a plurality of windows of the input data. Accordingly, there will be a plurality of output values generated from each filter. It can be seen from FIGS. 10-12 that for almost all the filters, the output values based on the adjusted weights (i.e. the weights quantised in accordance with the method 400 of FIG. 4) had a smaller error than the output values based on the quantised weights (i.e. the weights quantised according to the round to nearest rounding method alone).

As shown in Table 3, in this first example test scenario the mean quantisation errors $E^q$ and $E^a$ over all the output values were 17.552 and 16.420 respectively showing that a significant overall improvement can be achieved by quantising the weights in accordance with the method 400 of FIG. 4.

TABLE 3

| Input | $E^q$ (all output values) | $E^a$ (all output values) |
|---|---|---|
| uniform [0, 4) | 17.552 | 16.420 |

Figure 13:
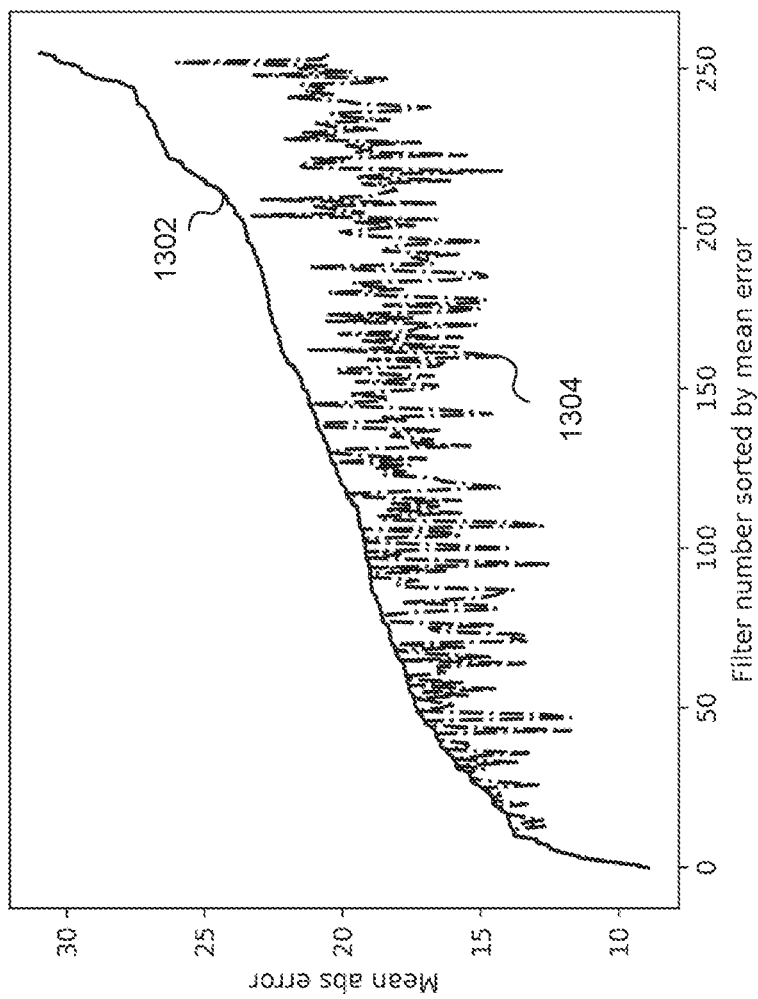
FIG. 13 is a graph illustrating the mean per filter quantisation error for a second example convolution layer when the weights are quantised to a fixed point number format according to a standard quantisation method, and when the weights are quantised to the fixed point number format according to the method of FIG. 4.
Figure 14:
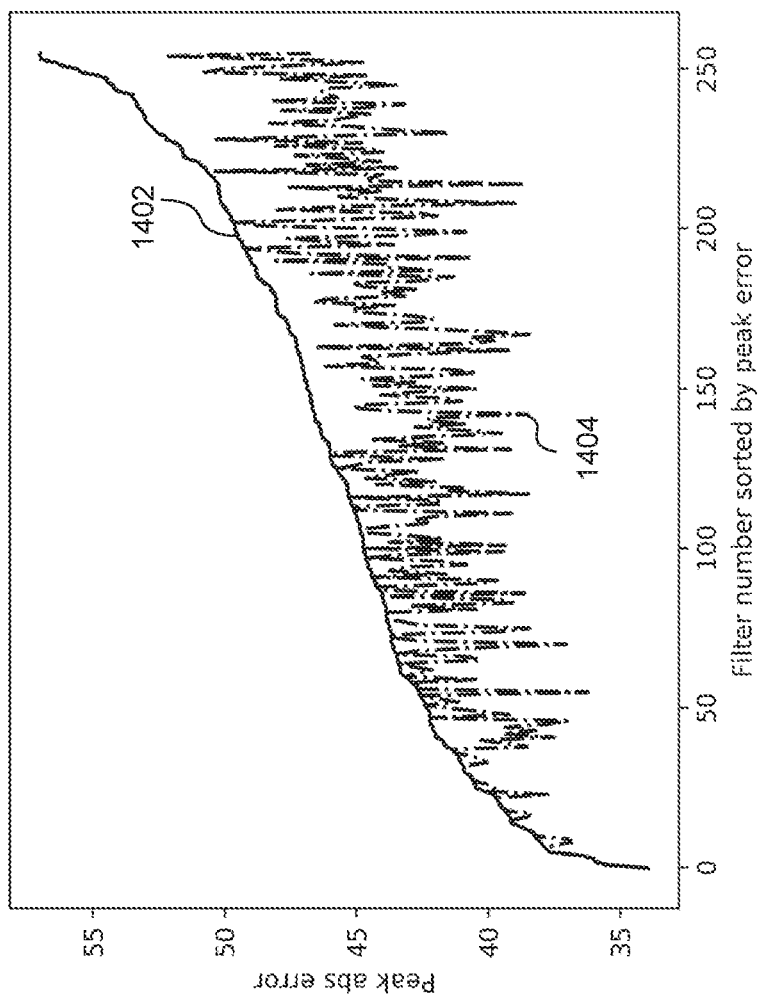
FIG. 14 is a graph illustrating the maximum per filter quantisation error for the second example convolution layer when the weights are quantised to a fixed point number format according to a standard quantisation method, and when the weights are quantised to the fixed point number format according to the method of FIG. 4.
Figure 15:
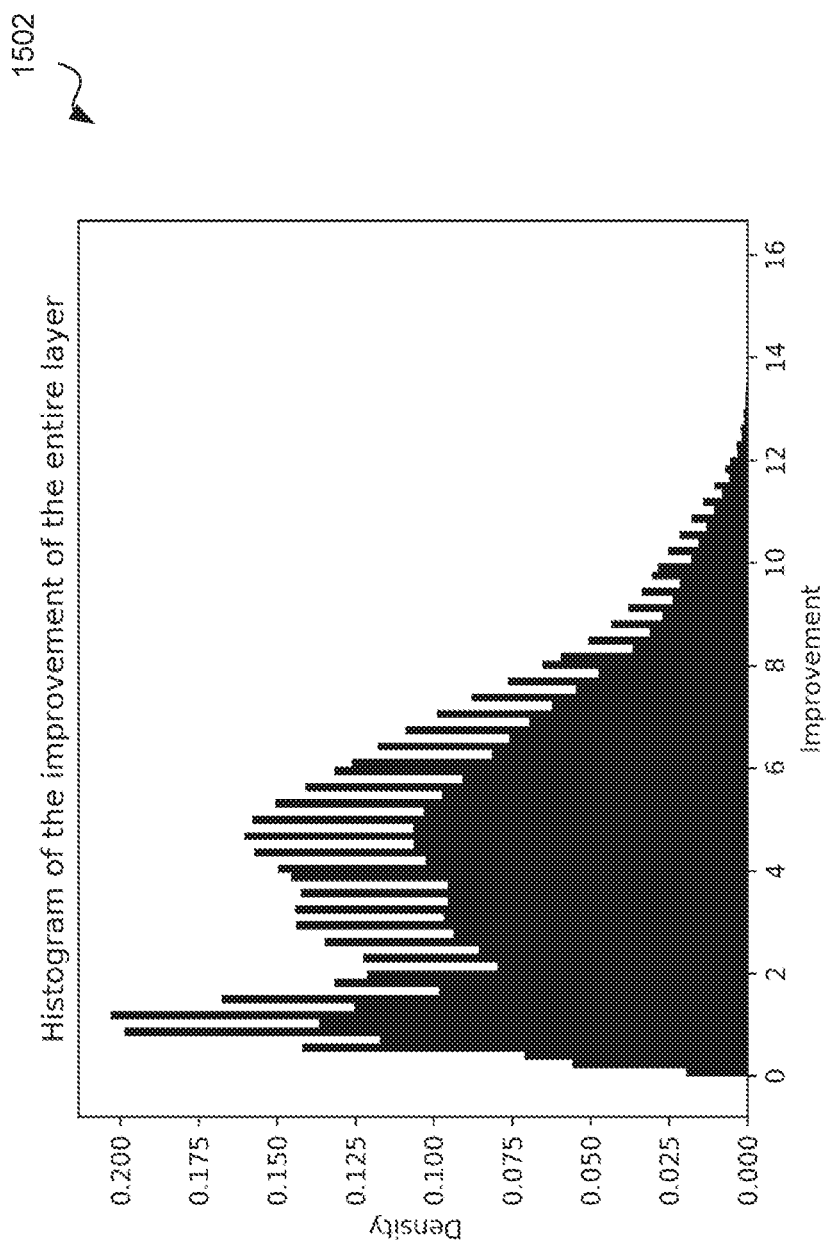
FIG. 15 is a density histogram illustrating the improvement in the per output quantisation error for the second example convolution layer achieved by quantising the weights according to the method of FIG. 4.

Reference is now made to FIGS. 13-15 which show graphs illustrating the improvement in the error in the output by quantising the weights in accordance with the method 400 of FIG. 4 compared to quantising the weights according to a round to nearest rounding mode in a second example test scenario where the input values were uniform random numbers in the set [0, 4) and the weights were uniform random numbers in the set (−1.01, 1.01). Specifically, FIG. 13 shows graphs 1302, 1304 of the mean absolute quantisation errors $E^q$ and $E^a$ for each filter respectively, FIG. 14 shows graphs 1402, 1404 of the maximum absolute quantisation errors $M^q$ and $M^a$ for each filter, and FIG. 15 shows a density histogram 1502 of the improvement in the per output quantisation error (i.e. $error^q - error^a$) for the layer (i.e. for the outputs). As described above, a density histogram is a histogram in which the area of each rectangle equals the relative frequency of the corresponding class/bin and the area of the entire histogram equals 1. Accordingly, in the density histogram 1502 of FIG. 15 each bin corresponds to a particular range of per output quantisation error improvements and the density of each bin is equal to the number of outputs which have an improvement in the quantisation error that falls within that bin divided by the bin width x total number of outputs.

It can be seen from FIGS. 13-15 that for almost all the filters, the output values based on the adjusted weights (i.e. the weights quantised according to the method 400 of FIG. 4 wherein the first quantisation is the round to nearest rounding mode) had a smaller error than the output values based on the quantised weights (i.e. the weights quantised according to the round to nearest rounding method).

As shown in Table 4, in this second example test scenario, the mean quantisation errors $E^q$ and $E^a$ over all the output values were 20.57 and 17.14 respectively showing that a significant overall improvement can be achieved by quantising the weights in accordance with the method 400 of FIG. 4.

TABLE 4

| Input | $E^q$ (all output values) | $E^\sigma$ (all output values) |
|---|---|---|
| uniform [0, 4) | 20.57 | 17.14 |

Figure 16:
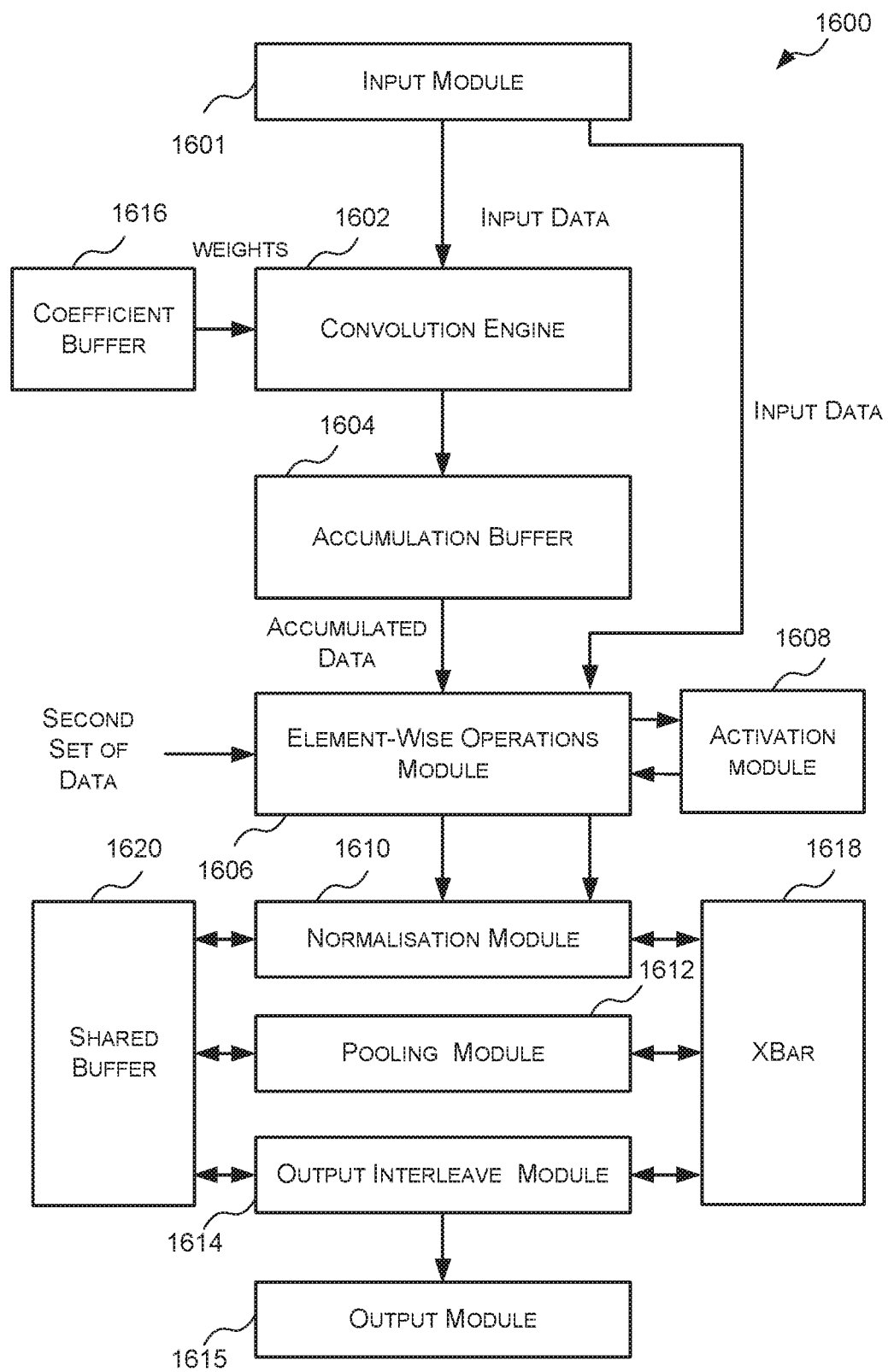
FIG. 16 is a block diagram of an example DNN accelerator.

Reference is now made to Tables 5 to 7 which illustrate the Top-1 and Top-5 classification accuracy of a GoogLeNet DNN implemented on the DNN accelerator of FIG. 16 when the input values and weights of the DNN are quantised to fixed point number formats with 6 bits, 5 bits and 4 bits respectively. Each table shows the Top-1 and Top-5 classification accuracy of the DNN when the weights are (a) quantised from floating point number formats to the specified fixed point number format in accordance with a round to nearest quantisation method, (b) quantised from floating point number formats to the specified fixed point number format in accordance with a round to nearest quantisation method and retrained after quantisation, and (c) quantised from floating point number formats to the specified fixed point number format in accordance with the method 400 of FIG. 4 without any retraining. As is known to those of skill the art, the Top-1 classification accuracy is a measure of whether the correct classification is the top output of the DNN; and a Top-5 classification accuracy is a measure of whether the correct classification is in the top-five outputs of the DNN.

TABLE 5

| | Weight Bit-Width | Top-1 Accuracy (%) | Top-5 Accuracy (%) |
|---|---|---|---|
| Quantised in accordance with the round to nearest rounding method | 6 | 66.382 | 86.825 |
| Retrained after Quantisation | 6 | 66.575 | 86.896 |
| Quantised in accordance with the method 400 of FIG. 4 | 6 | 66.813 | 87.101 |

TABLE 6

| | Weight Bit-Width | Top-1 Accuracy (%) | Top-5 Accuracy (%) |
|---|---|---|---|
| Quantised in accordance with the round to nearest rounding method | 5 | 63.145 | 84.736 |
| Retrained after Quantisation | 5 | 65.706 | 86.369 |
| Quantised in accordance with the method 400 of FIG. 4 | 5 | 65.081 | 86.091 |

TABLE 7

| | Weight Bit-Width | Top-1 Accuracy (%) | Top-5 Accuracy (%) |
|---|---|---|---|
| Quantised in accordance with the round to nearest rounding method | 4 | 62.846 | 84.509 |
| Retrained after Quantisation | 4 | 65.319 | 86.250 |
| Quantised in accordance with the method 400 of FIG. 4 | 4 | 64.667 | 85.843 |

It can be seen from Tables 5 to 7 that the described methods of converting weights of a DNN to fixed point number formats result in a GoogLeNet DNN with an improved accuracy with respect to a GoogLeNet DNN which is created by simply quantising the weights according to a standard quantisation method such as round to nearest. In most cases, converting the weights according to the described methods results in a GoogLeNet DNN with an accuracy at least as good as a GoogLeNet DNN that is re-trained after an initial quantisation and in some cases results in a GoogLeNet DNN with better accuracy.

Reference is now made to Tables 8 to 10 which illustrate the Top-1 and Top-5 classification accuracy of an AlexNet DNN implemented on the DNN accelerator 1600 of FIG. 16 when the input values and weights of the DNN are quantised to fixed point number formats with 6 bits, 5 bits and 4 bits respectively. Each table shows the Top-1 and Top-5 classification accuracy of the DNN when the weights are (a) quantised from floating point number formats to the specified fixed point number format in accordance with the round to nearest quantisation method, (b) quantised from floating point number formats to the specified fixed point number format in accordance with the round to nearest quantisation method and retrained after quantisation, and (c) quantised from floating point number formats to the specified fixed point number format in accordance with the method 400 of FIG. 4.

TABLE 8

| | Weight Bit-Width | Top-1 Accuracy (%) | Top-5 Accuracy (%) |
|---|---|---|---|
| Quantised in accordance with the round to nearest rounding method | 6 | 54.060 | 77.039 |
| Retrained after Quantisation | 6 | 53.273 | 76.867 |
| Quantised in accordance with the method 400 of FIG. 4 | 6 | 54.946 | 77.841 |

TABLE 9

| | Weight Bit-Width | Top-1 Accuracy (%) | Top-5 Accuracy (%) |
|---|---|---|---|
| Quantised in accordance with the round to nearest rounding method | 5 | 52.068 | 74.948 |
| Retrained after Quantisation | 5 | 53.156 | 76.662 |
| Quantised in accordance with the method 400 of FIG. 4 | 5 | 54.306 | 77.284 |

TABLE 10

| | Weight Bit-Width | Top-1 Accuracy (%) | Top-5 Accuracy (%) |
|---|---|---|---|
| Quantised in accordance with the round to nearest rounding method | 4 | 41.416 | 65.886 |
| Retrained after Quantisation | 4 | 51.134 | 74.910 |
| Quantised in accordance with the method 400 of FIG. 4 | 4 | 51.400 | 74.794 |

It can be seen from Tables 8 to 10 that the described methods of converting weights of a DNN to fixed point number formats result in an AlexNet DNN with an improved accuracy with respect to an AlexNet DNN which is created by simply quantising the weights according to a standard quantisation method. In most cases, converting the weights according to the described methods results in an AlexNet DNN with an accuracy at least as good as an AlexNet DNN that is re-trained after an initial quantisation and in many cases results in an AlexNet DNN with better accuracy.

Example DNN Accelerator

Reference is now made to FIG. 16 which illustrates example hardware logic which can be configured to implement a DNN using the quantised weights for a filter of the DNN generated in accordance with the method 400 of FIG. 4 or method 700 of FIG. 7. Specifically FIG. 16 illustrates an example DNN accelerator 1600.

The DNN accelerator 1600 of FIG. 16 is configured to compute the output of a DNN through a series of hardware passes (which also may be referred to as processing passes) wherein during each pass the DNN accelerator receives at least a portion of the input data for a layer of the DNN and processes the received input data in accordance with that layer (and optionally in accordance with one or more following layers) to produce processed data. The processed data is either output to memory for use as input data for a subsequent hardware pass or output as the output of the DNN. The number of layers that the DNN accelerator can process during a single hardware pass may be based on the size of the data, the configuration of the DNN accelerator and the order of the layers. For example, where the DNN accelerator comprises hardware logic to perform each of the possible layer types a DNN that comprises a first convolution layer, a first activation layer, a second convolution layer, a second activation layer, and a pooling layer may be able to receive the initial DNN input data and process that input data according to the first convolution layer and the first activation layer in the first hardware pass and then output the output of the activation layer into memory, then in a second hardware pass receive that data from memory as the input and process that data according to the second convolution layer, the second activation layer, and the pooling layer to produce the output data for the DNN.

The example DNN accelerator 1600 of FIG. 16 comprises an input module 1601, a convolution engine 1602, an accumulation buffer 1604, an element-wise operations module 1606, an activation module 1608, a normalisation module 1610, a pooling module 1612, an output interleave module 1614 and an output module 1615. Each module or engine implements or processes all or a portion of one or more types of layers. Specifically, together the convolution engine 1602 and the accumulation buffer 1604 implement or process a convolution layer or a fully connected layer. The activation module 1608 processes or implements an activation layer. The normalisation module 1610 processes or implements a normalisation layer. The pooling module 1612 implements a pooling layer and the output interleave module 1614 processes or implements an interleave layer.

The input module 1601 is configured to receive the input data to be processed and provides it to a downstream module for processing.

The convolution engine 1602 is configured to perform a convolution operation on the received input data using the weights associated with a particular convolution layer. The weights for each convolution layer (which may be generated by the method 400 of FIG. 4 or the method 700 of FIG. 7) of the DNN may be stored in a coefficient buffer 1616 as shown in FIG. 16 and the weights for a particular convolution layer may be provided to the convolution engine 1602 when that particular convolution layer is being processed by the convolution engine 1602. Where the DNN accelerator supports variable weight formats then the convolution engine 1602 may be configured to receive information indicating the format or formats of the weights of the current convolution layer being processed to allow the convolution engine to properly interpret and process the received weights.

The convolution engine 1602 may comprise a plurality of multipliers (e.g. 128) and a plurality of adders which add the result of the multipliers to produce a single sum. Although a single convolution engine 1602 is shown in FIG. 16, in other examples there may be multiple (e.g. 8) convolution engines so that multiple windows can be processed simultaneously. The output of the convolution engine 1602 is fed to the accumulation buffer 1604.

The accumulation buffer 1604 is configured to receive the output of the convolution engine and add it to the current contents of the accumulation buffer 1604. In this manner, the accumulation buffer 1604 accumulates the results of the convolution engine 1602 over several hardware passes of the convolution engine 1602. Although a single accumulation buffer 1604 is shown in FIG. 16, in other examples there may be multiple (e.g. 8, one per convolution engine) accumulation buffers. The accumulation buffer 1604 outputs the accumulated result to the element-wise operations module 1606 which may or may not operate on the accumulated result depending on whether an element-wise layer is to be processed during the current hardware pass.

The element-wise operations module 1606 is configured to receive either the input data for the current hardware pass (e.g. when a convolution layer is not processed in the current hardware pass) or the accumulated result from the accumulation buffer 1604 (e.g. when a convolution layer is processed in the current hardware pass). The element-wise operations module 1606 may either process the received input data or pass the received input data to another module (e.g. the activation module 1608 and/or the normalisation module 1610) depending on whether an element-wise layer is processed in the current hardware pass and/or depending whether an activation layer is to be processed prior to an element-wise layer. When the element-wise operations module 1606 is configured to process the received input data the element-wise operations module 1606 performs an element-wise operation on the received data (optionally with another data set (which may be obtained from external memory)). The element-wise operations module 1606 may be configured to perform any suitable element-wise operation such as, but not limited to add, multiply, maximum, and minimum. The result of the element-wise operation is then provided to either the activation module 1608 or the normalisation module 1610 depending on whether an activation layer is to be processed subsequent the element-wise layer or not.

The activation module 1608 is configured to receive one of the following as input data: the original input to the hardware pass (via the element-wise operations module 1606) (e.g. when a convolution layer is not processed in the current hardware pass); the accumulated data (via the element-wise operations module 1606) (e.g. when a convolution layer is processed in the current hardware pass and either an element-wise layer is not processed in the current hardware pass or an element-wise layer is processed in the current hardware pass but follows an activation layer). The activation module 1608 is configured to apply an activation function to the input data and provide the output data back to the element-wise operations module 1606 where it is forwarded to the normalisation module 1610 directly or after the element-wise operations module 1606 processes it. In some cases, the activation function that is applied to the data received by the activation module 1608 may vary per activation layer. In these cases, information specifying one or more properties of an activation function to be applied for each activation layer may be stored (e.g. in memory) and the relevant information for the activation layer processed in a particular hardware pass may be provided to the activation module 1608 during that hardware pass.

In some cases, the activation module 1608 may be configured to store, in entries of a lookup table, data representing the activation function. In these cases, the input data may be used to lookup one or more entries in the lookup table and output values representing the output of the activation function. For example, the activation module 1608 may be configured to calculate the output value by interpolating between two or more entries read from the lookup table.

In some examples, the activation module 1608 may be configured to operate as a Rectified Linear Unit (ReLU) by implementing a ReLU function. In a ReLU function, the output element $y_{i,j,k}$ is calculated by identifying a maximum value as set out in equation (24) wherein for x values less than 0, y=0:

$$y_{i,j,k}=f(x_{i,j,k})=\max\{0,x_{i,j,k}\} \quad (24)$$

In other examples, the activation module 1608 may be configured to operate as a Parametric Rectified Linear Unit (PReLU) by implementing a PReLU function. The PReLU function performs a similar operation to the ReLU function. Specifically, where $w_1, w_2, b_1, b_2 \in \mathbb{R}$ are constants, the PReLU is configured to generate an output element $y_{i,j,k}$ as set out in equation (25):

$$y_{i,j,k}=f(x_{i,j,k};w_1,w_2,b_1,b_2)=\max\{(w_1*x_{i,j,k}+b_1),(w_2*x_{i,j,k}+b_2)\} \quad (25)$$

The normalisation module 1610 is configured to receive one of the following as input data: the original input data for the hardware pass (via the element-wise operations module 1606) (e.g. when a convolution layer is not processed in the current hardware pass and neither an element-wise layer nor an activation layer is processed in the current hardware pass); the accumulation output (via the element-wise operations module 1606) (e.g. when a convolution layer is processed in the current hardware pass and neither an element-wise layer nor an activation layer is processed in the current hardware pass); and the output data of the element-wise operations module and/or the activation module. The normalisation module 1610 then performs a normalisation function on the received input data to produce normalised data. In some cases, the normalisation module 1610 may be configured to perform a Local Response Normalisation (LRN) Function and/or a Local Contrast Normalisation (LCN) Function. However, it will be evident to a person of skill in the art that these are examples only and that the normalisation module 1610 may be configured to implement any suitable normalisation function or functions. Different normalisation layers may be configured to apply different normalisation functions.

The pooling module 1612 may receive the normalised data from the normalisation module 1610 or may receive the input data to the normalisation module 1610 via the normalisation module 1610. In some cases, data may be transferred between the normalisation module 1610 and the pooling module 1612 via a crossbar switch (shown as XBar 1618). The term crossbar switch is used herein to refer to a simple hardware module that contains routing logic which connects multiple modules together in a dynamic fashion. In this example, the crossbar switch may dynamically connect the normalisation module 1610, the pooling module 1612 and/or the output interleave module 1614 depending on which layers will be processed in the current hardware pass. Accordingly, the crossbar switch may receive information each pass indicating which modules 1610, 1612, 1614 are to be connected.

The pooling module 1612 is configured to perform a pooling function, such as, but not limited to, a max or mean function, on the received data to produce pooled data. The purpose of a pooling layer is to reduce the spatial size of the representation to reduce the number of parameters and computation in the network, and hence to also control overfitting. In some examples, the pooling operation is performed over a sliding window that is defined per pooling layer.

The output interleave module 1614 may receive the normalised data from the normalisation module 1610, the input data to the normalisation function (via the normalisation module 1610), or the pooled data from the pooling module 1612. In some cases, the data may be transferred between the normalisation module 1610, the pooling module 1612 and the output interleave module 1614 via a crossbar switch 1618. The output interleave module 1614 is configured to perform a rearrangement operation to produce data that is in a predetermined order. This may comprise sorting and/or transposing the received data. The data generated by the last of the layers is provided to the output module 1615 where it is converted to the desired output format for the current hardware pass.

The normalisation module 1610, the pooling module 1612, and the output interleave module 1614 may each have access to a shared buffer 1620 which can be used by these modules 1610, 1612 and 1614 to write data to and retrieve data from. For example, the shared buffer 1620 may be used by these modules 1610, 1612, 1614 to rearrange the order of the received data or the generated data. For example, one or more of these modules 1610, 1612, 1614 may be configured to write data to the shared buffer 1620 and read the same data out in a different order. In some cases, although each of the normalisation module 1610, the pooling module 1612 and the output interleave module 1614 have access to the shared buffer 1620, each of the normalisation module 1610, the pooling module 1612 and the output interleave module 1614 may be allotted a portion of the shared buffer 1620 which only they can access. In these cases, each of the normalisation module 1610, the pooling module 1612 and the output interleave module 1614 may only be able to read data out of the shared buffer 1620 that they have written into the shared buffer 1620.

The modules of the DNN accelerator 1600 that are used or active during any hardware pass are based on the layers that are processed during that hardware pass. In particular, only the modules or components related to the layers processed during the current hardware pass are used or active. As described above, the layers that are processed during a particular hardware pass is determined (typically in advance, by, for example, a software tool) based on the order of the layers in the DNN and optionally one or more other factors (such as the size of the data). For example, in some cases the DNN accelerator may be configured to perform the processing of a single layer per hardware pass unless multiple layers can be processed without writing data to memory between layers. For example, if a first convolution layer is immediately followed by a second convolution layer each of the convolution layers would have to be performed in a separate hardware pass as the output data from the first hardware convolution needs to be written out to memory before it can be used as an input to the second. In each of these hardware passes only the modules, components or engines relevant to a convolution layer, such as the convolution engine 1602 and the accumulation buffer 1604, may be used or active.

Although the DNN accelerator 1600 of FIG. 16 illustrates a particular order in which the modules, engines etc. are arranged and thus how the processing of data flows through the DNN accelerator, it will be appreciated that this is an example only and that in other examples the modules, engines may be arranged in a different manner. Furthermore, other hardware logic (e.g. other DNN accelerators) may implement additional or alternative types of DNN layers and thus may comprise different modules, engines etc.

Figure 17:
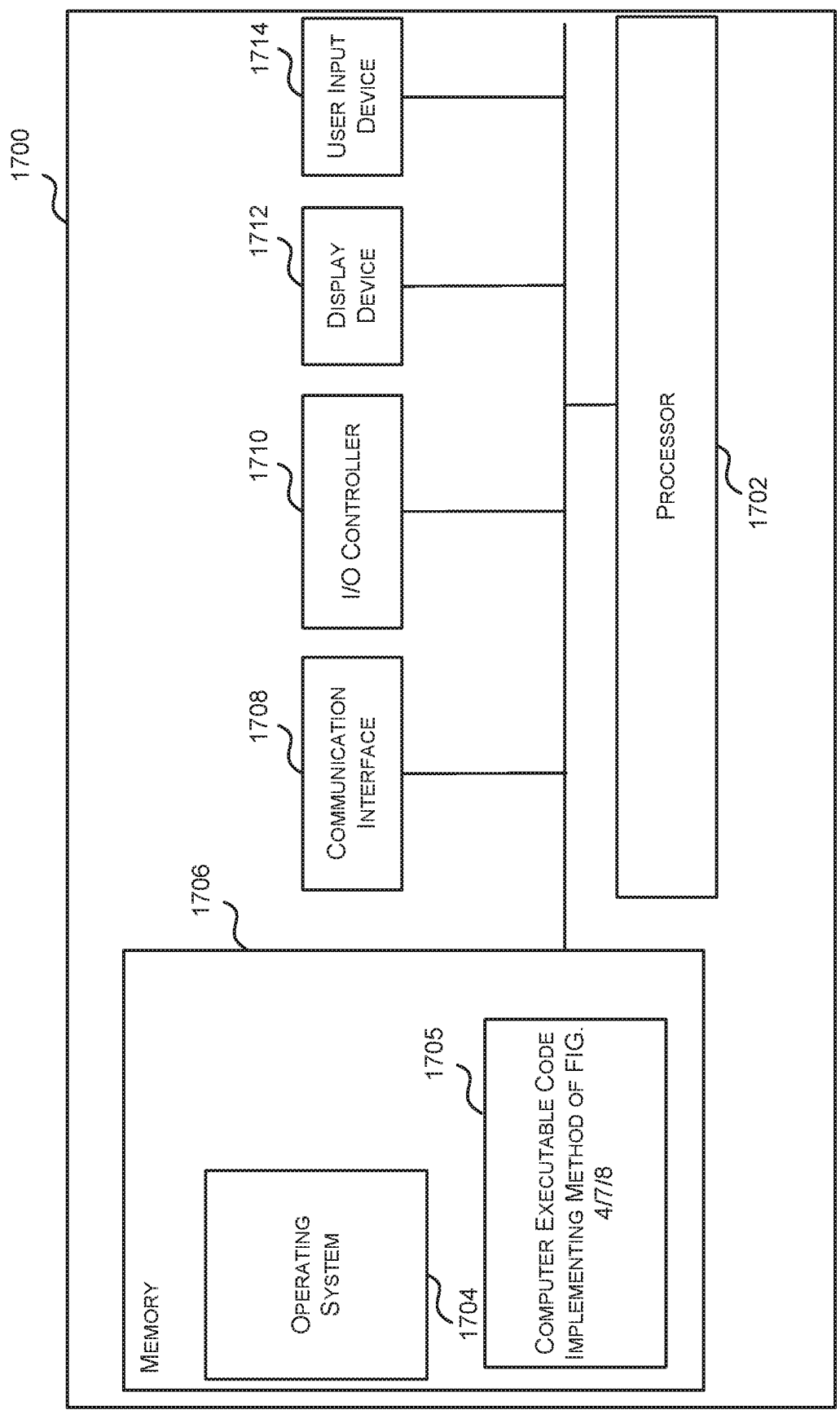
FIG. 17 is a block diagram of an example computing-based device.

FIG. 17 illustrates various components of an exemplary general purpose computing-based device 1700 which may be implemented as any form of a computing and/or electronic device, and in which embodiments of the methods 400, 700 and 800 of FIGS. 4, 7 and 8 described above may be implemented.

Computing-based device 1700 comprises one or more processors 1702 which may be microprocessors, controllers or any other suitable type of processors for processing computer executable instructions to control the operation of the device in order to assess the performance of an integrated circuit defined by a hardware design in completing a task. In some examples, for example where a system on a chip architecture is used, the processors 1702 may include one or more fixed function blocks (also referred to as accelerators) which implement a part of the method of determining the fixed point number format for representing a set of values input to, or output from, a layer of a DNN in hardware (rather than software or firmware). Platform software comprising an operating system 1704 or any other suitable platform software may be provided at the computing-based device to enable application software, such as computer executable code 1705 for implementing one or more of the methods 400, 700 and 800 of FIGS. 4, 7 and 8, to be executed on the device.

The computer executable instructions may be provided using any computer-readable media that is accessible by computing-based device 1700. Computer-readable media may include, for example, computer storage media such as memory 1706 and communications media. Computer storage media (i.e. non-transitory machine readable media), such as memory 1706, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1706) is shown within the computing-based device 1700 it will be appreciated that the storage may be distributed or located remotely and accessed via a network or other communication link (e.g. using communication interface 1708).

The computing-based device 1700 also comprises an input/output controller 910 arranged to output display information to a display device 1712 which may be separate from or integral to the computing-based device 1700. The display information may provide a graphical user interface. The input/output controller 1710 is also arranged to receive and process input from one or more devices, such as a user input device 1714 (e.g. a mouse or a keyboard). In an embodiment the display device 1712 may also act as the user input device 1714 if it is a touch sensitive display device. The input/output controller 1710 may also output data to devices other than the display device, e.g. a locally connected printing device (not shown in FIG. 17).

Figure 18:
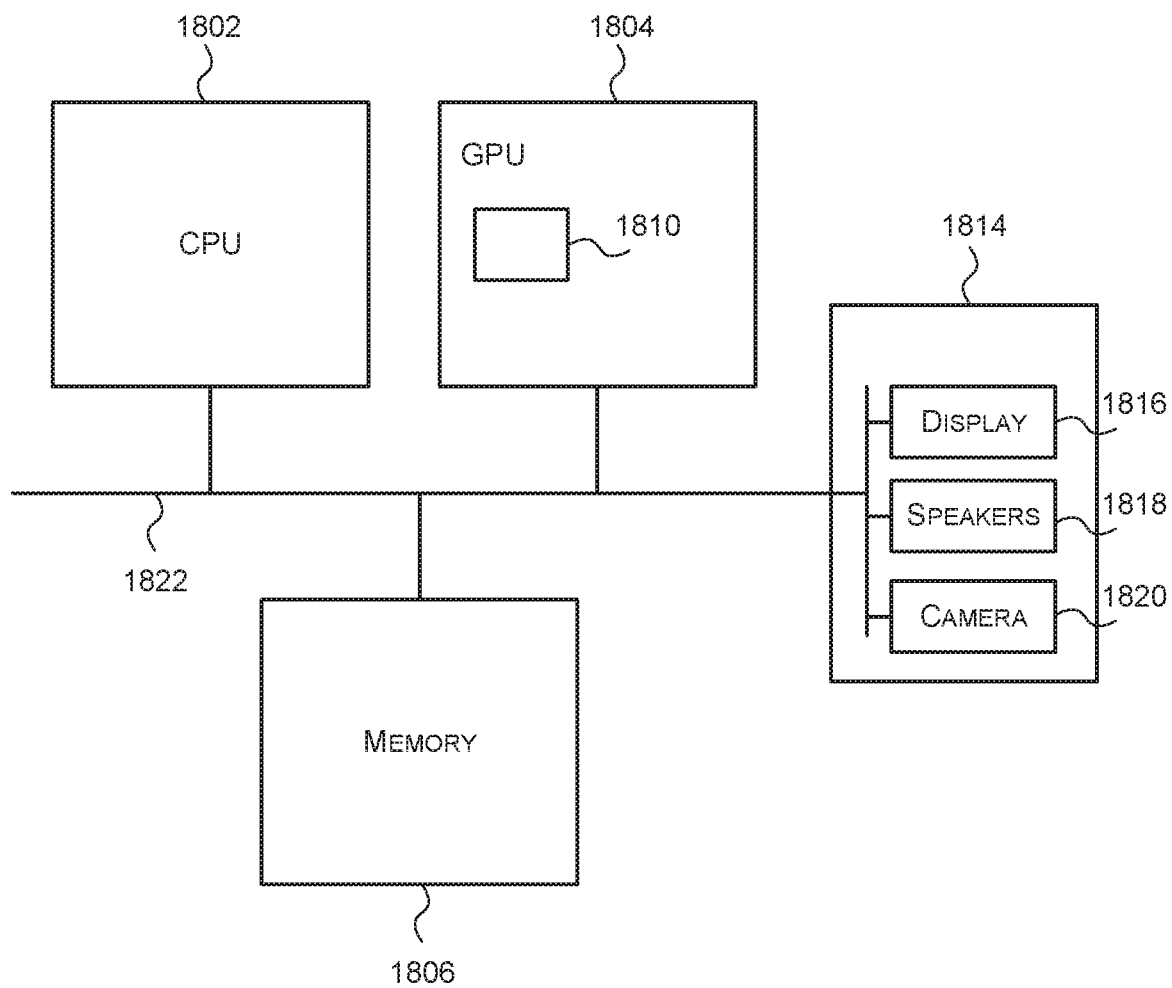
FIG. 18 is a block diagram of an example computer system in which a DNN accelerator may be implemented.

FIG. 18 shows a computer system in which the hardware logic (e.g. DNN accelerator) configurable to implement a DNN described herein may be implemented. The computer system comprises a CPU 1802, a GPU 1804, a memory 1806 and other devices 1814, such as a display 1816, speakers 1818 and a camera 1820. Hardware logic configurable to implement a DNN 1810 (e.g. the DNN accelerator 1600 of FIG. 16) may be implemented on the GPU 1804, as shown in FIG. 18. The components of the computer system can communicate with each other via the communications bus 1822. In other examples, the hardware logic configurable to implement a DNN 1810 may be implemented independent from the CPU or the GPU and may have a separate connection to a communications bus 1822. In some examples, there may not be a GPU and the CPU may provide control information to the hardware logic configurable to implement a DNN 1810.

The DNN accelerator 1600 of FIG. 16 is shown as comprising a number of functional blocks. This is schematic only and is not intended to define a strict division between different logic elements of such entities. Each functional block may be provided in any suitable manner. It is to be understood that intermediate values described herein as being formed by a DNN accelerator or a processing module need not be physically generated by the DNN accelerator or the processing module at any point and may merely represent logical values which conveniently describe the processing performed by the DNN accelerator or the processing module between its input and output.

The hardware logic configurable to implement a DNN (e.g. the DNN accelerator 1600 of FIG. 16) described herein may be embodied in hardware on an integrated circuit. Generally, any of the functions, methods, techniques or components described above can be implemented in software, firmware, hardware (e.g., fixed logic circuitry), or any combination thereof. The terms "module," "functionality,"

"component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture hardware logic configurable to implement a DNN (e.g. DNN accelerator) described herein. An integrated circuit definition dataset may be, for example, an integrated circuit description.

Therefore, there may be provided a method of manufacturing, at an integrated circuit manufacturing system, hardware logic configurable to implement a DNN (e.g. DNN accelerator 1600 of FIG. 16) as described herein. Furthermore, there may be provided an integrated circuit definition dataset that, when processed in an integrated circuit manufacturing system, causes the method of manufacturing hardware logic configurable to implement a DNN (e.g. DNN accelerator 1600 of FIG. 16) to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS (RTM) and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture hardware logic configurable to implement a DNN (e.g. DNN accelerator) will now be described with respect to FIG. 19.

Figure 19:
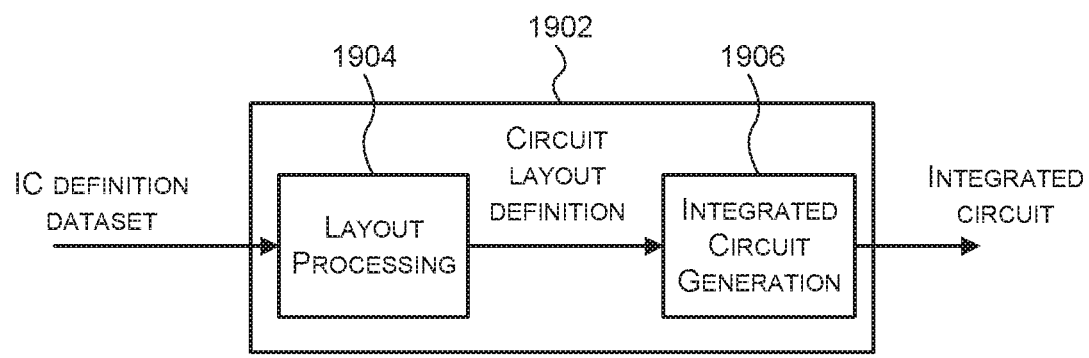
FIG. 19 is a block diagram of an example integrated circuit manufacturing system for generating an integrated circuit embodying a DNN accelerator as described herein.

FIG. 19 shows an example of an integrated circuit (IC) manufacturing system 1902 which is configured to manufacture hardware logic configurable to implement a DNN (e.g. DNN accelerator) as described in any of the examples herein. In particular, the IC manufacturing system 1902 comprises a layout processing system 1904 and an integrated circuit generation system 1906. The IC manufacturing system 1902 is configured to receive an IC definition dataset (e.g. defining hardware logic configurable to implement a DNN (e.g. DNN accelerator) as described in any of the examples herein), process the IC definition dataset, and generate an IC according to the IC definition dataset (e.g. which embodies hardware logic configurable to implement a DNN (e.g. DNN accelerator) as described in any of the examples herein). The processing of the IC definition dataset configures the IC manufacturing system 1902 to manufacture an integrated circuit embodying hardware logic configurable to implement a DNN (e.g. DNN accelerator) as described in any of the examples herein.

The layout processing system 1904 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1904 has determined the circuit layout it may output a circuit layout definition to the IC generation system 1906. A circuit layout definition may be, for example, a circuit layout description.

The IC generation system 1906 generates an IC according to the circuit layout definition, as is known in the art. For example, the IC generation system 1906 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1906 may be in the form of computer-readable code which the IC generation system 1906 can use to form a suitable mask for use in generating an IC.

The different processes performed by the IC manufacturing system 1902 may be implemented all in one location, e.g. by one party. Alternatively, the IC manufacturing system 1902 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture hardware logic configurable to implement a DNN (e.g. DNN accelerator) without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 19 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 19, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A computer-implemented method of converting a plurality of weights of a filter of a Deep Neural Network (DNN) in a first number format to a second number format to enable the DNN to be implemented in hardware logic, the second number format having less precision than the first number format, the method comprising:
   determining, for each of the plurality of weights, a quantisation error associated with quantising that weight to the second number format in accordance with a first quantisation method;
   determining a total quantisation error for the plurality of weights based on the quantisation errors for the plurality of weights;
   identifying a subset of the plurality of weights to be quantised to the second number format in accordance with a second quantisation method based on the total quantisation error for the plurality of weights; and
   generating a set of quantised weights representing the plurality of weights in the second number format, the quantised weight for each weight in the subset of the plurality of weights based on quantising that weight to the second number format in accordance with the second quantisation method and the quantised weight for each of the remaining weights of the plurality of weights based on quantising that weight to the second number format in accordance with the first quantisation method.

2. The method of claim 1, wherein the total quantisation error for the plurality of weights is a sum of the quantisation errors for the plurality of weights.

3. The method of claim 1, wherein the second number format is a fixed point number format, and the subset of the plurality of weights comprises N weights wherein N is equal to the total quantisation error divided by a step size of the second number format.

4. The method of claim 1, wherein determining the quantisation error associated with quantising a weight to the second number format in accordance with the first quantisation method comprises quantising the weight to the second number format in accordance with the first quantisation method to generate a quantised weight and determining the quantisation error from the quantised weight.

5. The method of claim 4, wherein quantising a weight to the second number format in accordance with the first quantisation method comprises quantising the weight to the second number format according to a round to nearest rounding mode.

6. The method of claim 4, wherein generating the set of quantised weights representing the plurality of weights in the second number format comprises replacing each quantised weight corresponding to a weight in the subset with a next representable number in the second number format in a predetermined direction from the quantised weight.

7. The method of claim 6, wherein replacing a quantised weight with the next representable number in the second number format in the predetermined direction comprises adding, or subtracting, a predetermined value to the corresponding weight to generate a modified weight and quantising the modified weight to the second number format in accordance with the first quantisation method.

8. The method of claim 1, wherein the quantisation error associated with quantising a weight to the second number format in accordance with the first quantisation method is determined without quantising that weight to the second number format in accordance with the first quantisation method.

9. The method of claim 1, wherein generating the set of quantised weights representing the plurality of weights in the second number format comprises:
quantising each weight in the subset of the plurality of weights to the second number format in accordance with the second quantisation method; and
quantising each remaining weight in the plurality of weights to the second number format in accordance with the first quantisation method.

10. The method of claim 9, wherein quantising a weight to the second number format in accordance with the first quantisation method comprises quantising the weight to the second number format according to a round to nearest rounding mode.

11. The method of claim 9, wherein:
quantising a weight to the second number format in accordance with the first quantisation method comprises quantising the weight to a first representable number in the second number format, and
quantising that weight to the second number format in accordance with the second quantisation method comprises quantising that weight to a second representable number in the second number format, wherein the second representable number is a next representable number to the first representable number in a predetermined direction.

12. The method of claim 6, wherein when the total quantisation error is positive the predetermined direction is a first direction and when the total quantisation error is negative the predetermined direction is a second direction opposite from the first direction.

13. The method of claim 9, wherein quantising a weight to the second number format in accordance with the second quantisation method comprises adding, or subtracting, a predetermined value to the weight to generate a modified weight and quantising the modified weight to the second number format in accordance with the first quantisation method.

14. The method of claim 1, wherein the second number format is a fixed point number format, and the subset of the plurality of weights comprises the weights with a quantisation error with a particular sign and having a magnitude closest to half a step size of the second number format.

15. The method of claim 1, further comprising:
determining, for each weight in the subset of the plurality of weights in the first number format, a second quantisation error associated with quantising that weight to the second number format in accordance with the second quantisation method;
determining a second total quantisation error for the plurality of weights based on the second quantisation errors for the weights in the subset and the quantisation errors for the weights not in the subset;
determining whether the second total quantisation error exceeds an error threshold; and
in response to determining that the second total quantisation error exceeds the error threshold, identifying a second subset of the plurality of weights to be quantised to the second number format in accordance with a third quantisation method based on the second total quantisation error;
wherein the quantised weight for each weight in the second subset is based on quantising that weight to the second number format in accordance with the third quantisation method.

16. The method of claim 1, wherein the second number format is a fixed point number format defined by an exponent and a mantissa bit-length.

17. The method of claim 1, wherein the first number format is a floating point number format.

18. The method of claim 1, further comprising configuring hardware logic to implement the DNN using the set of quantised weights.

19. A method of converting a filter of a Deep Neural Network "DNN" from a first number format to a second number format to enable the DNN to be implemented in hardware logic, the filter comprising a plurality of weights, the second number format having less precision than the first number format, the method comprising:
sub-dividing the plurality of weights of the filter into a plurality of non-overlapping subsets of weights; and
performing the method as set forth in claim 1 for each subset of weights.

20. A non-transitory computer readable storage medium having stored thereon computer readable instructions that, when executed at a computer system, cause the computer system to perform the method as set forth in claim 1.

* * * * *

UNITED STATES PATENT AND TRADEMARK OFFICE
CERTIFICATE OF CORRECTION

| | | |
|---|---|---|
| PATENT NO. | : 11,188,817 B2 | Page 1 of 2 |
| APPLICATION NO. | : 17/000468 | |
| DATED | : November 30, 2021 | |
| INVENTOR(S) | : Cagatay Dikici et al. | |

It is certified that error appears in the above-identified patent and that said Letters Patent is hereby corrected as shown below:

In the Specification

Column 12, Line 35 — $filtererror = \sum_{i=1}^{R} w_i^e$

Should read as — $filtererror = \sum_{i=1}^{R} w_i^e$

Column 13, Line 16 — In many cases $\sum_{i=1}^{R} x_i w_i^e$

Should read as — In many cases $\sum_{i=1}^{R} x_i w_i^e$

Column 13, Line 18 — reducing $|\sum_{i=1}^{R} x_i w_i^e|$.

Should read as — reducing $|\sum_{i=1}^{R} x_i w_i^e|$.

Column 18, Line 34 — number $W_{nearest}^{q}$

Should read as — number $w_{nearest}^{q}$

Column 18, Line 36 — $W_{nearest}^{e}$

Should read as — $w_{nearest}^{e}$

Column 18, Lines 50-54 — nearest representable number $W_{next\_nearest}^{q}$ the quantisation error $W_{next\_nearest}^{e}$ will be half a step size plus the delta Δ as Signed and Sealed this
Twenty-second Day of November, 2022

Katherine Kelly Vidal
*Director of the United States Patent and Trademark Office*

CERTIFICATE OF CORRECTION (continued)
U.S. Pat. No. 11,188,817 B2

Should read as shown in equation (17). Thus the quantisation errors $W_{nearest}^e$ and $W_{next\_nearest}^e$ will only have the same magni-representable number $W_{next\_nearest}^q$ the quantisation error $W_{next\_nearest}^e$ will be half a step size plus the delta $\Delta$ as shown in equation (17). Thus the quantisation errors $W_{nearest}^e$ and $W_{next\_nearest}^e$ will only have the same magnitude (i.e. half a step size) when the delta $\Delta$ is